(12) United States Patent
Matsumoto et al.

(10) Patent No.: US 11,695,389 B2
(45) Date of Patent: Jul. 4, 2023

(54) ACOUSTIC WAVE DEVICE, FRONT-END CIRCUIT, AND COMMUNICATION APPARATUS

(71) Applicant: Murata Manufacturing Co., Ltd., Nagaokakyo (JP)

(72) Inventors: Katsuya Matsumoto, Nagaokakyo (JP); Yasuyuki Ida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 782 days.

(21) Appl. No.: 16/722,023

(22) Filed: Dec. 20, 2019

(65) Prior Publication Data

US 2020/0127635 A1    Apr. 23, 2020

Related U.S. Application Data

(63) Continuation of application No. PCT/JP2018/023498, filed on Jun. 20, 2018.

(30) Foreign Application Priority Data

Jun. 23, 2017   (JP) .................................. 2017-123619

(51) Int. Cl.
   *H03H 9/02*   (2006.01)
   *H03H 3/08*   (2006.01)
   (Continued)

(52) U.S. Cl.
   CPC .......... *H03H 9/02897* (2013.01); *H03H 3/08* (2013.01); *H03H 9/02866* (2013.01);
   (Continued)

(58) Field of Classification Search
   CPC ........... H03H 9/02897; H03H 9/02866; H03H 9/6483; H03H 9/059; H03H 91/092; H03H 9/25; H03H 9/0542
   See application file for complete search history.

(56) References Cited

U.S. PATENT DOCUMENTS 7,474,175 B2 *   1/2009   Furihata ............... H03H 9/1085
                                            257/E23.125
9,130,539 B2 *   9/2015   Kikuchi ................... H03H 9/70
(Continued)

FOREIGN PATENT DOCUMENTS

JP   2007-134370 A   5/2007
JP   2013-247593 A   12/2013
(Continued)

OTHER PUBLICATIONS

Official Communication issued in International Patent Application No. PCT/JP2018/023498 dated Aug. 7, 2018.
(Continued)

*Primary Examiner* — J. San Martin
(74) *Attorney, Agent, or Firm* — Keating & Bennett, LLP

(57) ABSTRACT

An acoustic wave device includes an element substrate having piezoelectricity, a functional electrode on a first main surface of the element substrate, an extended wiring line electrically connected to the functional electrode and extending from the first main surface to a side surface of the element substrate, an external terminal electrically connected to the extended wiring line and on a second main surface of the element substrate, a first resin portion to seal the acoustic wave device, and a second resin portion at least between the extended wiring line on the side surface and the first resin portion. The second resin portion has a lower Young's modulus than the first resin portion.

20 Claims, 13 Drawing Sheets

(51) Int. Cl.
*H03H 9/05* (2006.01)
*H03H 9/10* (2006.01)
*H03H 9/25* (2006.01)
*H03H 9/64* (2006.01)

(52) U.S. Cl.
CPC .......... *H03H 9/059* (2013.01); *H03H 9/0542* (2013.01); *H03H 9/1092* (2013.01); *H03H 9/25* (2013.01); *H03H 9/6483* (2013.01)

(56) References Cited

U.S. PATENT DOCUMENTS

| | | | |
|---|---|---|---|
| 11,368,138 B2 * | 6/2022 | Hayashi | H03H 9/14541 |
| 11,515,856 B2 * | 11/2022 | Matsumoto | H03H 9/02842 |
| 2014/0125197 A1 | 5/2014 | Fujita et al. | |
| 2017/0194937 A1 | 7/2017 | Iwamoto | |
| 2018/0013404 A1 | 1/2018 | Kawasaki et al. | |
| 2018/0102761 A1 | 4/2018 | Takai et al. | |

FOREIGN PATENT DOCUMENTS

| | | |
|---|---|---|
| JP | 2015-053470 A | 3/2015 |
| WO | 2013/128823 A1 | 9/2013 |
| WO | 2016/060072 A1 | 4/2016 |
| WO | 2016/208287 A1 | 12/2016 |
| WO | 2017/013968 A1 | 1/2017 |

OTHER PUBLICATIONS

Official Communication issued in corresponding Japanese Patent Application No. 2019-525670, dated Aug. 4, 2020.

* cited by examiner

ACOUSTIC WAVE DEVICE, FRONT-END CIRCUIT, AND COMMUNICATION APPARATUS

CROSS REFERENCE TO RELATED APPLICATIONS

This application claims the benefit of priority to Japanese Patent Application No. 2017-123619 filed on Jun. 23, 2017 and is a Continuation Application of PCT Application No. PCT/JP2018/023498 filed on Jun. 20, 2018. The entire contents of each application are hereby incorporated herein by reference.

BACKGROUND OF THE INVENTION

1. Field of the Invention

The present invention relates to an acoustic wave device including a sealing resin, and a front-end circuit and a communication apparatus that include the acoustic wave device.

2. Description of the Related Art

Hitherto, acoustic wave devices have widely been used as band pass filters. As an example of the acoustic wave devices, International Publication No. WO/2016/208287 describes an acoustic wave device including an element substrate, an IDT electrode formed on a front surface side of the element substrate, and an external terminal formed on a rear surface (mount surface) side of the element substrate. In this acoustic wave device, the IDT electrode and the external terminal are connected to each other, with an extended wiring line formed on a side surface of the element substrate interposed therebetween (see FIG. 10 of International Publication No. WO/2016/208287).

However, the acoustic wave device described in International Publication No. WO/2016/208287 has an issue that the extended wiring line provided on the side surface of the element substrate breaks when an external force is added to the acoustic wave device after being sealed with resin.

SUMMARY OF THE INVENTION

Preferred embodiments of the present invention each prevent breaks in extended wiring lines on side surfaces of element substrates in acoustic wave devices including sealing resin.

An acoustic wave device according to a preferred embodiment of the present invention includes an element substrate that includes a first main surface and a second main surface facing away from each other and a side surface connecting the first main surface and the second main surface to each other and that has piezoelectricity at least partially; a functional electrode that is provided on the first main surface of the element substrate; an extended wiring line that is electrically connected to the functional electrode and that extends from the first main surface to the side surface of the element substrate; an external terminal that is electrically connected to the extended wiring line and that is provided directly or indirectly on the second main surface of the element substrate; a first resin portion that seals the acoustic wave device; and a second resin portion that is provided at least between the extended wiring line provided on the side surface and the first resin portion. The second resin portion has a lower Young's modulus than the first resin portion.

With this structure in which the second resin portion is provided between the extended wiring line and the first resin portion and the second resin portion has a lower Young's modulus than the first resin portion, a force to be added to the extended wiring line can be reduced when an external force is added to the acoustic wave device. Accordingly, it is possible to prevent a break in the extended wiring line provided on the side surface of the element substrate.

An acoustic wave device according to a preferred embodiment of the present invention includes an element substrate that includes a first main surface and a second main surface facing away from each other and a side surface connecting the first main surface and the second main surface to each other and that has piezoelectricity at least partially; a functional electrode that is provided on the first main surface of the element substrate; an extended wiring line that is electrically connected to the functional electrode and that extends from the first main surface to the side surface of the element substrate; an external terminal that is electrically connected to the extended wiring line and that is provided directly or indirectly on the second main surface of the element substrate; a first resin portion that seals the acoustic wave device; and a second resin portion that is provided at least between the extended wiring line provided on the side surface and the first resin portion. The second resin portion has a lower filler content than the first resin portion.

With this structure in which the second resin portion is provided between the extended wiring line and the first resin portion and the second resin portion has a lower filler content than the first resin portion, the Young's modulus of the second resin portion can be made lower than the Young's modulus of the first resin portion. Thus, a force to be added to the extended wiring line can be reduced when an external force is added to the acoustic wave device. Accordingly, it is possible to prevent a break in the extended wiring line provided on the side surface of the element substrate.

The acoustic wave device may further include a third resin portion. The element substrate may include a first corner portion that is a portion at which the second main surface adjoins the side surface. The extended wiring line may extend from the side surface to the first corner portion and the second main surface. The third resin portion may be provided at least between the extended wiring line provided at the first corner portion and the first resin portion and may have a lower Young's modulus than the first resin portion.

With this structure in which the third resin portion is provided between the extended wiring line and the first resin portion at the first corner portion and the third resin portion has a lower Young's modulus than the first resin portion, a force to be added to the extended wiring line can be reduced when an external force is added to the acoustic wave device. Accordingly, it is possible to prevent a break in the extended wiring line provided at the corner portion of the element substrate.

The acoustic wave device may further include a cover layer. The functional electrode may include an IDT electrode. The second resin portion may further be provided around the IDT electrode in a direction along the first main surface. The cover layer may be provided on the second resin portion so as to cover the IDT electrode in a direction perpendicular to the first main surface.

The acoustic wave device may further include an insulating layer. The element substrate may include at least a supporting substrate including a silicon material and a piezoelectric layer that is provided directly or indirectly on the supporting substrate. The insulating layer may be provided between the extended wiring line and the supporting substrate.

With this structure in which the insulating layer is provided between the supporting substrate and the extended wiring line, it is possible to prevent flowing of a leak current into the supporting substrate.

The element substrate may include at least a supporting substrate and a piezoelectric layer that is provided directly or indirectly on the supporting substrate. When the element substrate is viewed in a cross section from a direction perpendicular to the first main surface, a side surface of the piezoelectric layer may be located on an inner side of the side surface of the element substrate. The extended wiring line may extend from the second main surface to the side surface of the piezoelectric layer and the side surface of the element substrate.

With this structure, for example, in the case of manufacturing acoustic wave devices by cutting a mother substrate including a plurality of element substrates by using a dicing blade, it is possible to prevent the piezoelectric layer from being touched by the dicing blade and to prevent cracking or interfacial delamination of the piezoelectric layer.

The element substrate may include a supporting substrate and a piezoelectric layer that is provided directly on the supporting substrate. The functional electrode may be provided on the piezoelectric layer. An acoustic velocity of a bulk wave that propagates through the supporting substrate may be higher than an acoustic velocity of an acoustic wave that propagates through the piezoelectric layer.

With this structure, an acoustic wave propagating from the piezoelectric layer can be reflected by an interface between the supporting substrate and the piezoelectric layer and can be returned to the piezoelectric layer. Accordingly, it is possible to efficiently confine the energy of the acoustic wave within the piezoelectric layer.

The element substrate may include a supporting substrate, a piezoelectric layer that is provided indirectly on the supporting substrate, and an intermediate layer that is provided between the supporting substrate and the piezoelectric layer. The functional electrode may be provided on the piezoelectric layer. An acoustic velocity of a bulk wave that propagates through the intermediate layer may be lower than an acoustic velocity of an acoustic wave that propagates through the piezoelectric layer. An acoustic velocity of a bulk wave that propagates through the supporting substrate may be higher than the acoustic velocity of the acoustic wave that propagates through the piezoelectric layer.

With this structure, an acoustic wave propagating from the piezoelectric layer to the intermediate layer can be reflected by an interface between the supporting substrate and the intermediate layer and can be returned to the piezoelectric layer. Accordingly, it is possible to efficiently confine the energy of the acoustic wave within the piezoelectric layer.

The element substrate may include a supporting substrate, a piezoelectric layer that is provided indirectly on the supporting substrate, and an intermediate layer that is provided between the supporting substrate and the piezoelectric layer. The functional electrode may be provided on the piezoelectric layer. The intermediate layer may include a low-acoustic-velocity film in which an acoustic velocity of a bulk wave that propagates therethrough is lower than an acoustic velocity of an acoustic wave that propagates through the piezoelectric layer, and a high-acoustic-velocity film in which an acoustic velocity of a bulk wave that propagates therethrough is higher than the acoustic velocity of the acoustic wave that propagates through the piezoelectric layer. The low-acoustic-velocity film may be provided between the piezoelectric layer and the supporting substrate. The high-acoustic-velocity film may be provided between the low-acoustic-velocity film and the supporting substrate.

With this structure, an acoustic wave propagating from the piezoelectric layer to the low-acoustic-velocity film can be reflected by an interface between the high-acoustic-velocity film and low-acoustic-velocity film and can be returned to the piezoelectric layer. Accordingly, it is possible to efficiently confine the energy of the acoustic wave within the piezoelectric layer.

The element substrate may be bonded to one main surface of a mount substrate with the external terminal interposed therebetween. The first resin portion may further cover the one main surface of the mount substrate.

In such a case where the first resin portion covers the one main surface of the mount substrate, a force to be added to the extended wiring line can be reduced when an external force is added to the acoustic wave device.

A front-end circuit according to a preferred embodiment of the present invention includes the above-described acoustic wave device.

With this structure, it is possible to provide the front-end circuit including the acoustic wave device in which a break in the extended wiring line is prevented.

A communication apparatus according to a preferred embodiment of the present invention includes the above-described front-end circuit and a signal processing circuit that processes a high-frequency signal.

With this structure, it is possible to increase the reliability of the communication apparatus.

According to preferred embodiments of the present invention, it is possible to prevent a break in an extended wiring line provided on a side surface of an element substrate in an acoustic wave device including a sealing resin.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
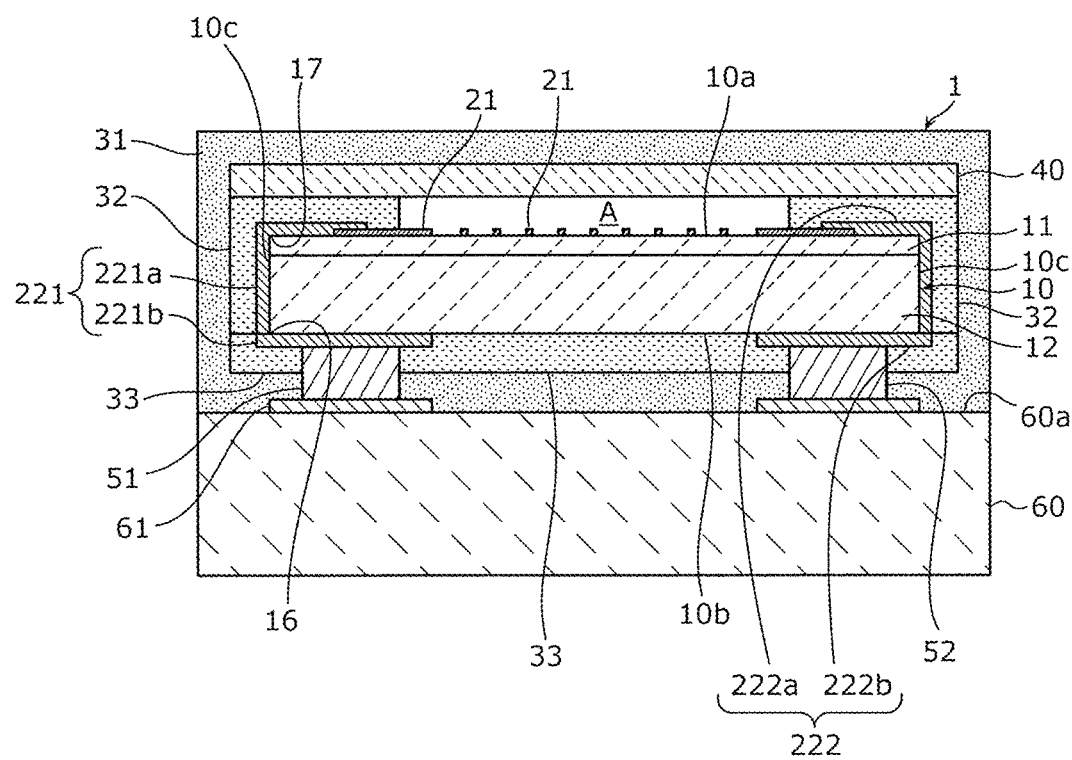
FIG. 1 is a cross-sectional view illustrating an example of an acoustic wave device according to a first preferred embodiment of the present invention.

Hereinafter, preferred embodiments of the present invention will be described in detail by using the preferred embodiments and the drawings. Each of the preferred embodiments described below is a general or specific example. The values, shapes, materials, components, and the arrangement and connection manner of the components described in the following preferred embodiments are examples and are not intended to limit the present invention. Among the components in the following preferred embodiments, a component not described in a dependent claim will be described as an optional component. In addition, the sizes or size ratios of the components illustrated in the drawings are not necessarily accurate.

First Preferred Embodiment

1-1. Configuration of Acoustic Wave Device

Figure 2A:
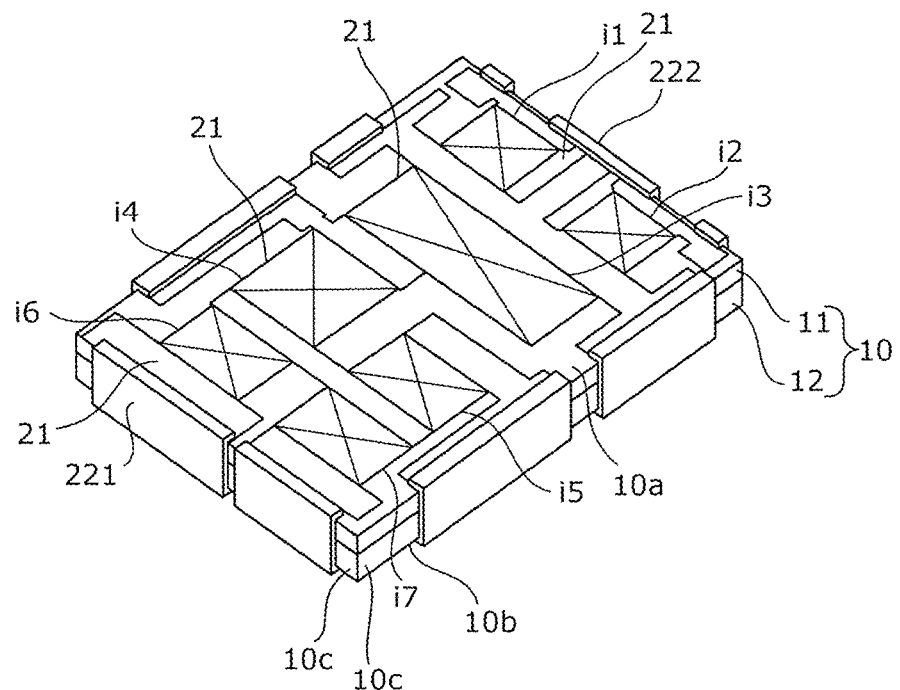
FIG. 2A is a perspective view illustrating an example of an element substrate, a functional electrode, a first extended wiring line, and a second extended wiring line of the acoustic wave device according to the first preferred embodiment of the present invention.
Figure 2B:
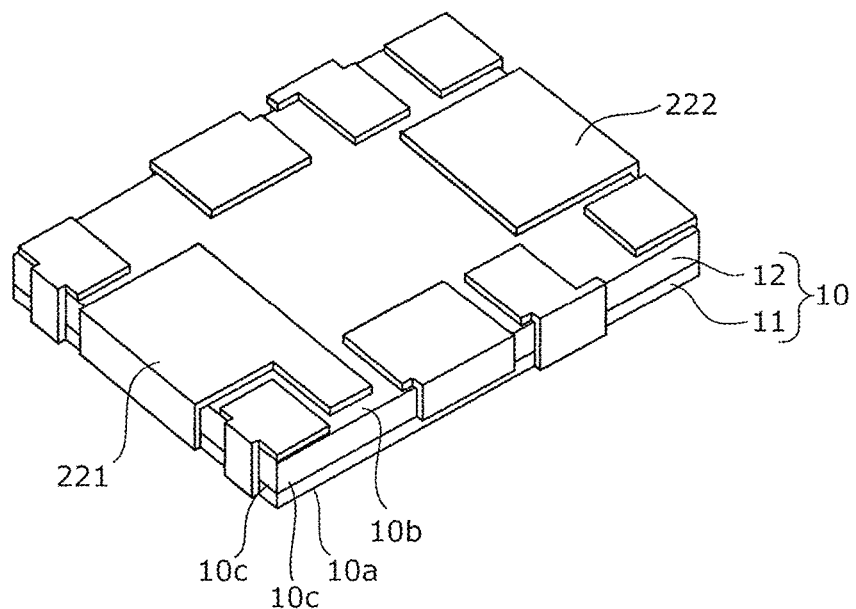
FIG. 2B is a perspective view of the element substrate, the first extended wiring line, and the second extended wiring line illustrated in FIG. 2A viewed from the rear surface side.

FIG. 1 is a cross-sectional view illustrating an example of an acoustic wave device 1 according to a first preferred embodiment of the present invention. FIG. 2A is a perspective view illustrating an example of an element substrate 10, a functional electrode 21, a first extended wiring line 221, and a second extended wiring line 222 of the acoustic wave device 1. FIG. 2B is a perspective view of the element substrate 10, the first extended wiring line 221, and the second extended wiring line 222 of the acoustic wave device 1 illustrated in FIG. 2A viewed from the rear surface side. In FIGS. 2A and 2B, the illustration of a first resin portion 31, a second resin portion 32, a third resin portion 33, a cover layer 40, a first external terminal 51, and a second external terminal 52 is omitted.

As illustrated in FIG. 1, the acoustic wave device 1 includes the element substrate 10; the functional electrode 21, the first extended wiring line 221, and the second extended wiring line 222 that are provided on the element substrate 10; the cover layer 40 that covers the functional electrode 21; the first external terminal 51 connected to the first extended wiring line 221; and the second external terminal 52 connected to the second extended wiring line 222. In addition, the acoustic wave device 1 includes the first resin portion 31 provided so as to seal the acoustic wave device 1; the second resin portion 32 provided between the element substrate 10 and the first resin portion 31; and the third resin portion 33. The acoustic wave device 1 is mounted on a mount substrate 60 by using the first external terminal 51 and the second external terminal 52.

Hereinafter, the first extended wiring line 221 may be referred to as an extended wiring line 221, the second extended wiring line 222 may be referred to as an extended wiring line 222, the first external terminal 51 may be referred to as an external terminal 51, and the second external terminal 52 may be referred to as an external terminal 52.

The element substrate 10 is plate-shaped and includes a first main surface 10a and a second main surface 10b that face away from each other, and side surfaces 10c that adjoin both the first main surface 10a and the second main surface 10b and that connect the first main surface 10a and the second main surface 10b. The second main surface 10b is a surface located to the mount substrate 60 side when the acoustic wave device 1 is mounted on the mount substrate 60. The element substrate 10 includes second corner portions 17, which are portions at which the first main surface 10a and the side surfaces 10c adjoin each other, and also includes first corner portions 16, which are portions at which the second main surface 10b and the side surfaces 10c adjoin each other. The cross-sectional view in FIG. 1 illustrates two side surfaces 10c, two first corner portions 16, and two second corner portions 17. The side surfaces 10c may be inclined with respect to the first main surface 10a or the second main surface 10b. The first main surface 10a and the second main surface 10b need not necessarily be parallel to each other. The cross section of the element substrate 10 may be trapezoid-shaped, parallelogram-shaped, or rectangle-shaped.

In addition, the element substrate 10 includes a supporting substrate 12 and a piezoelectric layer 11 provided directly on the supporting substrate 12. The piezoelectric layer 11 includes an upper surface corresponding to the above-described first main surface 10a, and the supporting substrate 12 includes a lower surface corresponding to the above-described second main surface 10b. The piezoelectric layer 11 is made of, for example, a piezoelectric single crystal, such as $LiTaO_3$ or $LiNbO_3$, or piezoelectric ceramics. The supporting substrate 12 is made of an insulator or semiconductor. The material of the supporting substrate 12 is, for example, Si, $Al_2O_3$, or the like. The acoustic velocity of a bulk wave that propagates through the supporting substrate 12 is higher than the acoustic velocity of an acoustic wave that propagates through the piezoelectric layer 11.

The functional electrode 21 is a metallic film provided on the first main surface 10a of the element substrate 10. The functional electrode 21 includes, for example, an interdigital transducer (IDT) electrode and a reflector. FIG. 2A illustrates acoustic wave resonators i1 to i7 including IDT electrodes and reflectors. In FIG. 2A, the acoustic wave resonators i1 to i7 are schematically illustrated with symbols each formed of "X" enclosed with a rectangular frame. The acoustic wave resonators i1 to i7 are electrically connected to each other on the first main surface 10a and form a filter circuit, such as a ladder filter. The functional electrode 21 is made of a metal, such as Al, Cu, or an AlCu alloy, or an alloy. The functional electrode 21 is not limited to a single-layer metallic film, and may be include a multilayer metallic film including a plurality of laminated metallic films. The acoustic wave resonators i1 to i7 are not limited to surface acoustic wave resonators, and may be boundary acoustic wave resonators.

The first extended wiring line 221 and the second extended wiring line 222 are band-shaped and are provided on each of the first main surface 10a, the side surfaces 10c, and the second main surface 10b of the element substrate 10. Specifically, the extended wiring line 221 includes an extended wiring line 221a and an extended wiring line 221b that are connected to each other. The extended wiring line 221a is provided so as to be electrically connected to the functional electrode 21 and to extend from the first main surface 10a to the side surface 10c via the second corner portion 17. The extended wiring line 221b is provided so as to be connected to an end portion of the extended wiring line 221a provided on the side surface 10c and to extend from the first corner portion 16 to the second main surface 10b.

The second extended wiring line 222 includes an extended wiring line 222a and an extended wiring line 222b that are connected to each other. The extended wiring line 222a is provided so as to be electrically connected to the functional electrode 21 and to extend from the first main surface 10a to the side surface 10c via the second corner portion 17. The extended wiring line 222b is provided so as to be connected to an end portion of the extended wiring line 222a provided on the side surface 10c and to extend from the first corner portion 16 to the second main surface 10b.

The extended wiring line 221b and the extended wiring line 222b are adjacent to each other on the second main surface 10b.

In the acoustic wave device 1, each of the extended wiring lines 221 and 222 extends along the periphery of the element substrate 10, and the heat generated on or around the first main surface 10a by driving of the functional electrode 21 can be transmitted and radiated toward the second main surface 10b through the individual extended wiring lines 221 and 222. In addition, because the functional electrode 21 is provided on the first main surface 10a, and the individual extended wiring lines 221 and 222 are extended from the functional electrode 21 to the second main surface 10b via the first main surface 10a and the side surfaces 10c, the extended wiring lines 221 and 222 are elongated so as to be capable of increasing heat radiation performance.

The extended wiring lines 221 and 222 are each made of, for example, a metallic material including Cu. The material of the extended wiring lines 221 and 222 is not limited to Cu, and may be a metallic material including Al. In addition, the extended wiring lines 221 and 222 may include a covering layer, such as gold plating.

The first external terminal 51 is electrically connected to the extended wiring line 221b provided on the second main surface 10b. The second external terminal 52 is electrically connected to the extended wiring line 222b provided on the second main surface 10b. The external terminals 51 and 52 each include a metallic member including Sn and Ag. The element substrate 10 is bonded to one main surface 60a of the mount substrate 60 with the external terminals 51 and 52 interposed therebetween.

The second resin portion 32 is provided along the first main surface 10a and the side surfaces 10c of the element substrate 10. When viewed from a direction perpendicular to the first main surface 10a, the second resin portion 32 is provided around the functional electrode 21 so as to surround the functional electrode 21 in a direction along the first main surface 10a. In addition, the second resin portion 32 is provided so as to cover the extended wiring lines 221a and 222a. The second resin portion 32 is higher than the functional electrode 21 on the first main surface 10a side. The configuration of the second resin portion 32 along the side surfaces 10c will be described below.

The cover layer 40 is a sheet made of a polyimide resin and is provided on the second resin portion 32 so as to cover the functional electrode 21 in a direction perpendicular to the first main surface 10a. The cover layer 40 is disposed at a predetermined distance from the functional electrode 21. The acoustic wave device 1 has an enclosed space A enclosed with the cover layer 40, the second resin portion 32, and the element substrate 10. The cover layer 40 has a larger area than the element substrate 10, and the side surfaces of the cover layer 40 are located on outer sides of the side surfaces 10c of the element substrate 10.

The first resin portion 31 is a sealing resin that seals the acoustic wave device 1. The first resin portion 31 is provided on outer sides of the first main surface 10a, the second main surface 10b, and the side surfaces 10c of the element substrate 10 so as to enclose the element substrate 10, the functional electrode 21, and the extended wiring lines 221 and 222. In addition, as described above, the first resin portion 31 covers the one main surface 60a of the mount substrate 60.

The first resin portion 31 is an insulating material including a filler and is made of, for example, an epoxy resin including silica particles. The epoxy resin has a Young's modulus (elastic modulus) of, for example, 17 GPa.

The second resin portion 32 is provided between the first resin portion 31 and the individual extended wiring lines 221a and 222a on outer sides of the side surfaces 10c of the element substrate 10. In addition, the second resin portion 32 is provided between the first resin portion 31 and the individual extended wiring lines 221a and 222a on outer sides of the second corner portions 17. The side surfaces of the second resin portion 32 are flush with the side surfaces of the cover layer 40. The second resin portion 32 is in contact with the extended wiring lines 221a and 222a, whereas the first resin portion 31 is not in contact with the extended wiring line 221a or 222a.

The second resin portion 32 is an insulating material and is made of, for example, an epoxy resin. The epoxy resin has a Young's modulus of, for example, 2 GPa. That is, the second resin portion 32 has a lower Young's modulus than the first resin portion 31. In the acoustic wave device 1, in which the second resin portion 32 has a lower Young's modulus, even in a case where an external force is added thereto, the force to be added to the extended wiring lines 221a and 222a is reduced.

When the second resin portion 32 has a lower filler content than the first resin portion 31, the Young's modulus of the second resin portion 32 can be made lower than the Young's modulus of the first resin portion 31. Thus, the force to be added to the extended wiring lines 221a and 222a can be reduced.

In addition, when the second resin portion 32 has a coefficient of linear expansion closer to the coefficient of linear expansion of the extended wiring lines 221a and 222a than to the coefficient of linear expansion of the first resin portion 31, not only an external force applied to the extended wiring lines 221a and 222a but also a heat stress applied to the extended wiring lines 221a and 222a can be reduced.

The third resin portion 33 is provided between the first resin portion 31 the individual extended wiring lines 221b and 222b on an outer side of the second main surface 10b of the element substrate 10. In addition, the third resin portion 33 is provided between the supporting substrate 12 and the first resin portion 31 in a region where neither the extended wiring line 221b nor 222b is provided on the second main surface 10b. In addition, the third resin portion 33 is provided between the first resin portion 31 and the individual extended wiring lines 221b and 222b on outer sides of the first corner portions 16. The third resin portion 33 is in contact with the extended wiring lines 221b and 222b, whereas the first resin portion 31 is not in contact with the extended wiring line 221b or 222b.

The third resin portion 33 is made of an insulating resin material and contains, for example, polyamic acid ester and ethyl lactate. The resin material of the third resin portion 33 has a glass transition temperature of about 200 degrees centigrade. At a temperature lower than or equal to the glass transition temperature, the resin material of the third resin portion 33 has a Young's modulus of about 3.5 GPa. That is, the third resin portion 33 has a lower Young's modulus than the first resin portion 31. In the acoustic wave device 1, in which the third resin portion 33 has a lower Young's modulus, even in a case where an external force is added thereto, the force to be added to the extended wiring lines 221b and 222b is reduced.

When the third resin portion 33 has a lower filler content than the first resin portion 31, the Young's modulus of the third resin portion 33 can be made lower than the Young's modulus of the first resin portion 31. Thus, the force to be added to the extended wiring lines 221a and 222a can be reduced.

When the third resin portion 33 has a coefficient of linear expansion closer to the coefficient of linear expansion of the extended wiring lines 221b and 222b than to the coefficient of linear expansion of the first resin portion 31, not only an external force applied to the extended wiring lines 221b and 222b but also a heat stress applied to the extended wiring lines 221b and 222b can be reduced.

Figure 3:
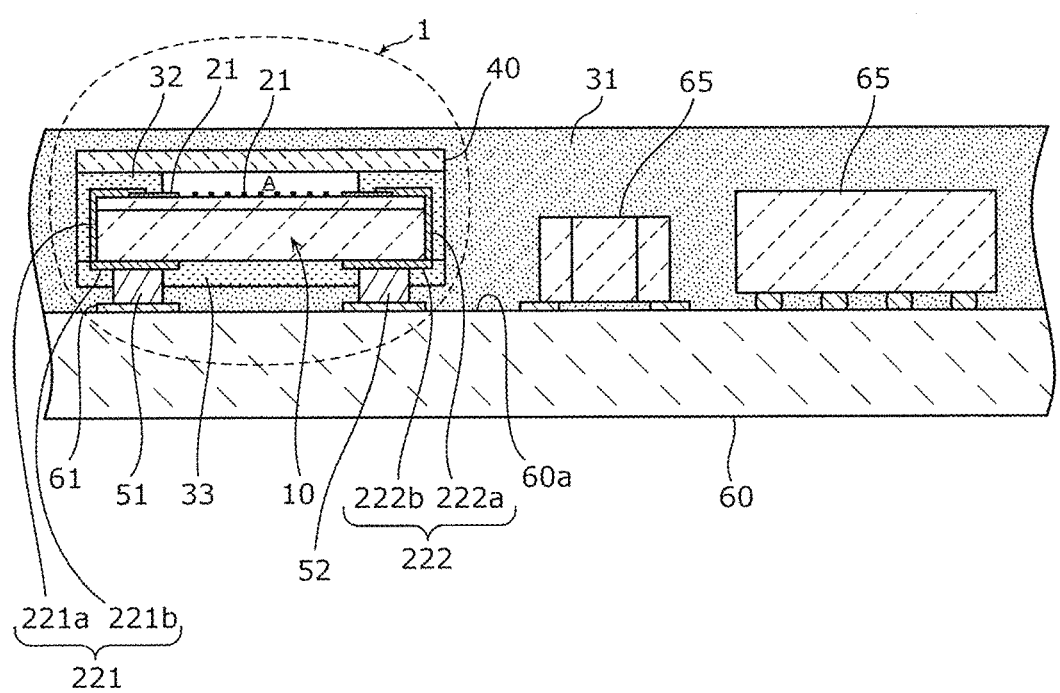
FIG. 3 is a cross-sectional view illustrating another example of the acoustic wave device according to the first preferred embodiment of the present invention.

FIG. 3 is a cross-sectional view illustrating another example of the acoustic wave device 1, in which the acoustic wave device 1 defines and functions as a portion of a high-frequency module. The high-frequency module includes, for example, the acoustic wave device 1, mounted components 65, and the mount substrate 60.

The mount substrate 60 is a printed circuit board. The one main surface 60a of the mount substrate 60 includes land electrodes 61 provided thereon. The external terminals 51 and 52 of the acoustic wave device 1 are connected to the mount substrate with the land electrodes 61 interposed therebetween. In addition to the acoustic wave device 1, a multilayer ceramic component and an IC chip, which are the mounted components 65, are mounted on the mount substrate 60. The first resin portion 31 is provided on the one main surface 60a of the mount substrate 60 so as to cover the acoustic wave device 1 and the mounted components 65. In this way, the acoustic wave device 1 may form the high-frequency module while being integrated with the mount substrate 60.

1-2. Method for Manufacturing Acoustic Wave Devices

Figure 4:
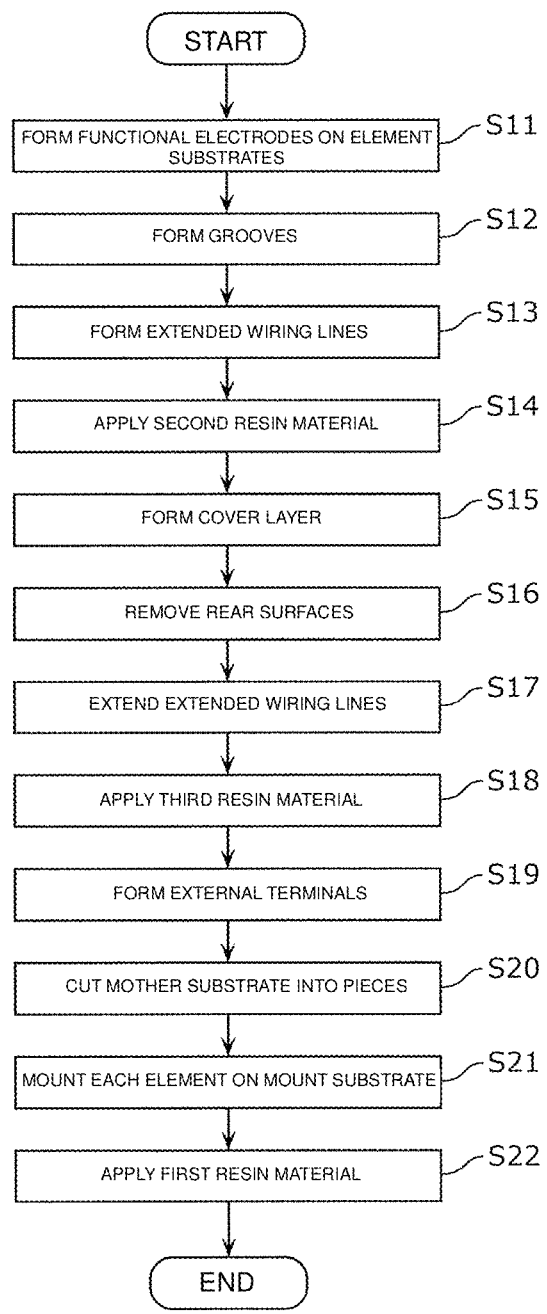
FIG. 4 is a flowchart illustrating a method for manufacturing the acoustic wave devices according to the first preferred embodiment of the present invention.

Next, a method for manufacturing the acoustic wave devices 1 will be described. FIG. 4 is a flowchart illustrating the method for manufacturing the acoustic wave devices 1.

Figure 5:
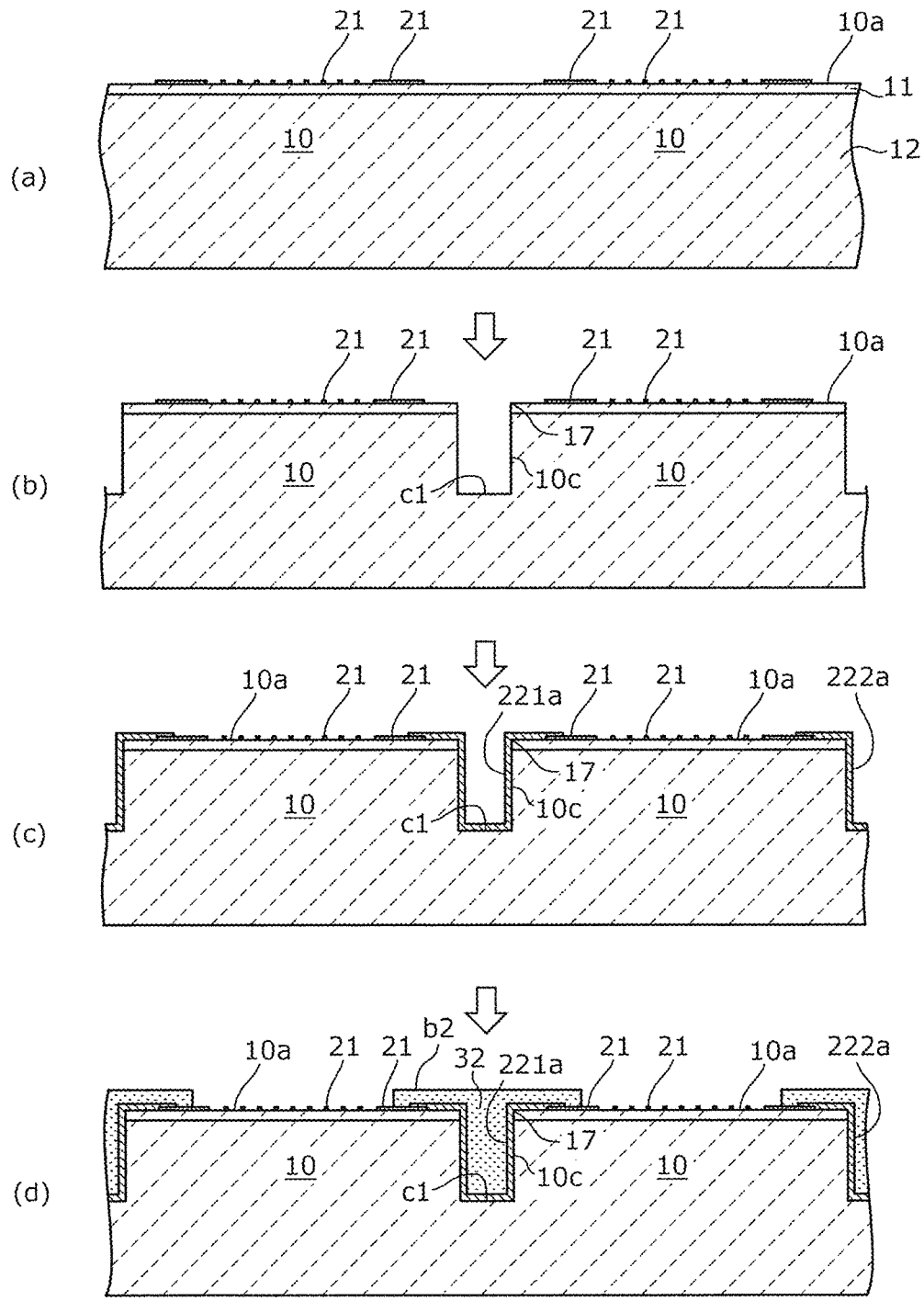
FIG. 5 includes diagrams illustrating the method for manufacturing the acoustic wave devices according to the first preferred embodiment of the present invention.
Figure 6:
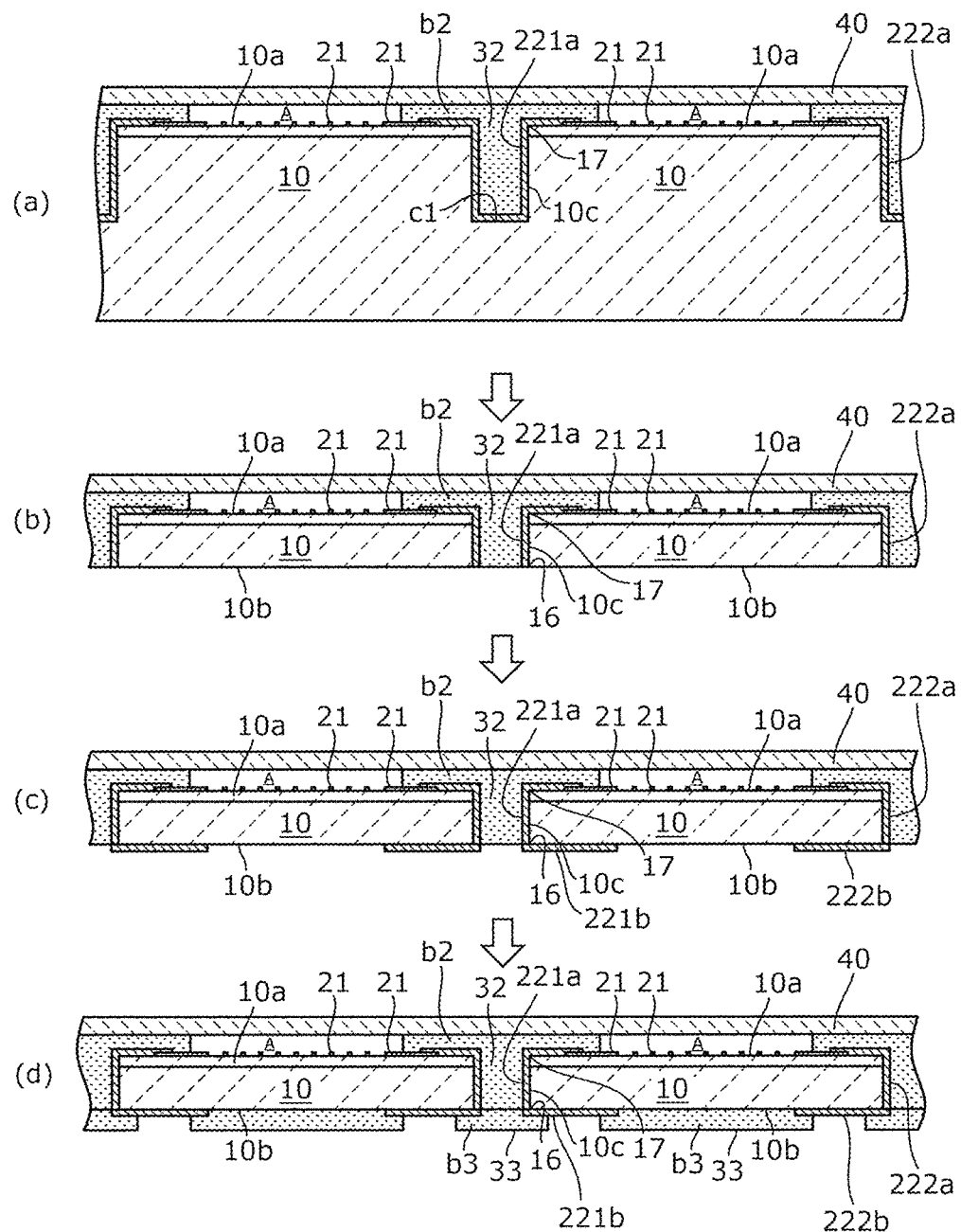
FIG. 6 includes diagrams illustrating the method for manufacturing the acoustic wave devices according to the first preferred embodiment of the present invention continued from FIG. 5.
Figure 7:
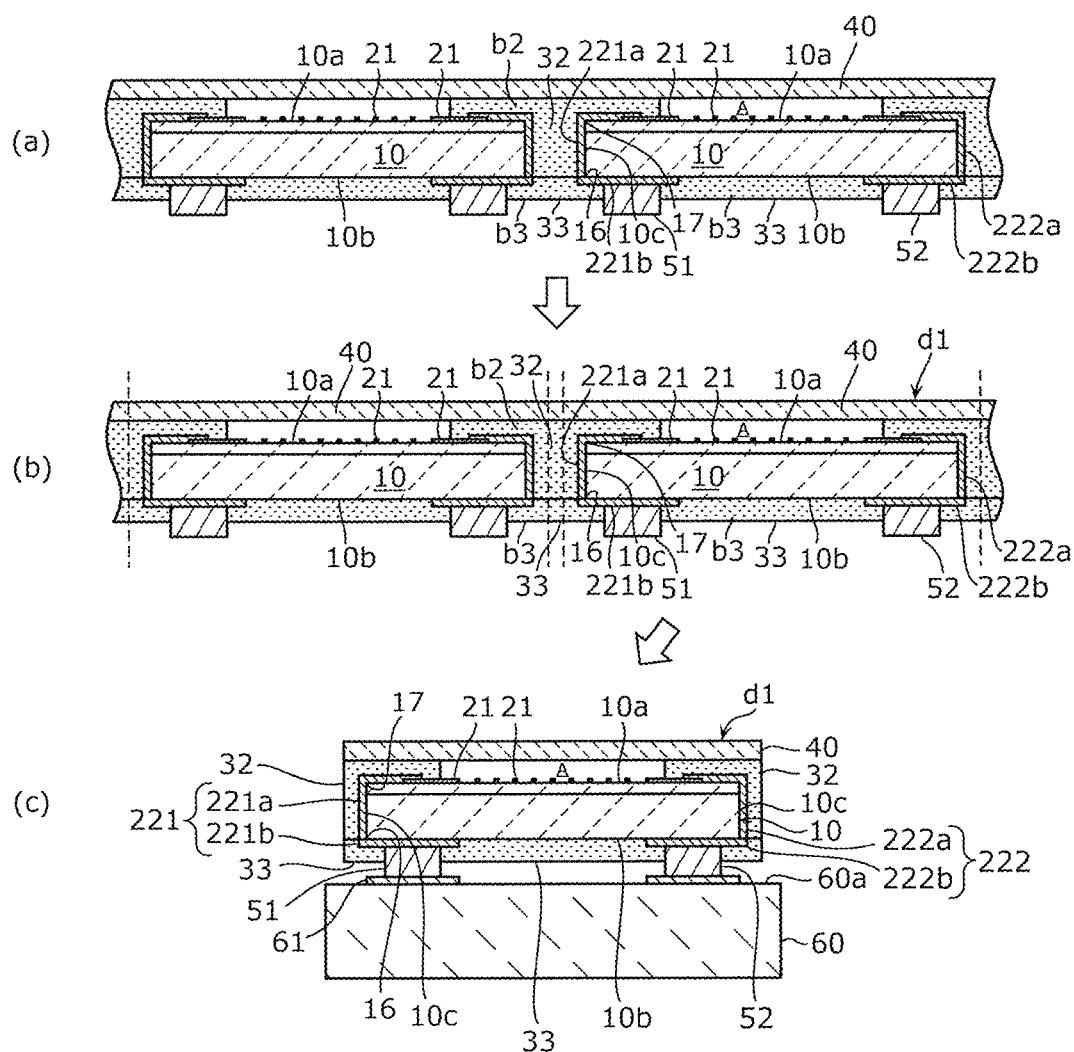
FIG. 7 includes diagrams illustrating the method for manufacturing the acoustic wave devices according to the first preferred embodiment of the present invention continued from FIG. 6.

FIG. 5 includes diagrams illustrating the method for manufacturing the acoustic wave devices 1, FIG. 6 includes diagrams illustrating the method for manufacturing the acoustic wave devices 1 continued from FIG. 5, and FIG. 7 includes diagrams illustrating the method for manufacturing the acoustic wave devices 1 continued from FIG. 6.

First, as illustrated in part (a) of FIG. 5, the functional electrodes 21 are provided on the element substrates 10 (S11). The functional electrodes 21 are provided on the first main surfaces 10a, which are the upper surfaces of the piezoelectric layers 11. The functional electrodes 21 are, for example, electrode films defining and functioning as IDT electrodes and reflectors. The element substrates 10 are in the state of a mother substrate before being divided into pieces. Part (a) of FIG. 5 illustrates two element substrates 10 as an example.

Subsequently, as illustrated in part (b) of FIG. 5, grooves c1 are formed in the element substrates 10 (S12). The grooves c1 are formed in a lattice pattern viewed from a direction perpendicular or substantially perpendicular to the first main surface 10a. As a result of forming the grooves c1, the side surfaces 10c of each element substrate 10 are formed.

Subsequently, as illustrated in part (c) of FIG. 5, the extended wiring lines 221a and 222a are formed on the surfaces of the grooves c1 and the surfaces of the element substrates 10 (S13). The extended wiring lines 221a and 222a are formed, with a predetermined film thickness, along the side surfaces 10c of the element substrates 10, which are side surfaces of the grooves c1, and the first main surfaces 10a of the element substrates 10. On the first main surfaces 10a, the extended wiring lines 221a and 222a are formed so as to be connected to the functional electrodes 21.

Subsequently, as illustrated in part (d) of FIG. 5, a second resin material b2 is applied onto the grooves c1 and the first main surfaces 10a on which the extended wiring lines 221a and 222a have been formed (S14). The resin material b2 is formed so as to cover the extended wiring lines 221a and 222a. In addition, the resin material b2 is formed so as to surround the functional electrodes 21 in a direction along the first main surfaces 10a and so as to be higher than the functional electrodes 21 in a height direction. As a result of applying and curing the resin material b2, the second resin portions 32 are formed on outer sides of the side surfaces 10c and outer sides of the second corner portions 17 of the element substrates 10.

Subsequently, as illustrated in part (a) of FIG. 6, the cover layer 40 is formed on the second resin portions 32 (S15). The cover layer 40 is a sheet made of a polyimide resin and is bonded to the second resin portions 32 with an adhesive. As a result of forming the cover layer 40, the enclosed spaces A are formed above the functional electrodes 21.

Subsequently, as illustrated in part (b) of FIG. 6, the rear surfaces of the element substrates 10 are removed by using a grinder or the like (S16). As a result of the removal, the second main surfaces 10b of the element substrates 10 are formed, and a portion of the extended wiring lines 221a and 222a and a portion of the second resin portions 32 that have been formed in the grooves c1 are exposed.

Subsequently, as illustrated in part (c) of FIG. 6, the extended wiring lines 221b and 222b are extended to the exposed second main surfaces 10b (S17). The extended wiring lines 221b and 222b are formed so as to be connected to the extended wiring lines 221a and 222a formed in step S13, respectively.

Subsequently, as illustrated in part (d) of FIG. 6, a third resin material b3 is applied onto the second main surfaces 10b on which the extended wiring lines 221b and 222b have been formed (S18). The resin material b3 is formed so as to cover the extended wiring lines 221b and 222b and to cover the second main surfaces 10b, except for the regions where the external terminals 51 and 52 are to be formed. As a result of applying and curing the resin material b3, the third resin portions 33 are formed on outer sides of the second main surfaces 10b and outer sides of the first corner portions 16 of the element substrates 10. The regions where the third resin portions 33 are not formed are recessed, and the extended wiring lines 221b or 222b are exposed there.

Subsequently, as illustrated in part (a) of FIG. 7, the external terminals 51 and 52 are formed in the regions where the third resin portions 33 are not formed (S19). The external terminals 51 and 52 are, for example, metallic bumps. As a result of forming the external terminals 51 and 52, the extended wiring lines 221b and the external terminals 51 are connected to each other, and the extended wiring lines 222b and the external terminals 52 are connected to each other.

Subsequently, as illustrated in part (b) of FIG. 7, the mother substrate including the plurality of element substrates 10 is cut into pieces (S20). The blade used for the cutting has a width smaller than the width of the groove c1 formed in step S12. As a result of the cutting, elements d1, each of which is a portion of the acoustic wave device 1, are formed, and the side surfaces of the cover layers 40, the second resin portions 32, and the third resin portions 33 are formed.

Subsequently, as illustrated in part (c) of FIG. 7, each element d1 obtained through the cutting is mounted on the mount substrate 60 (S21). The element d1 is bonded to the land electrodes 61 of the mount substrate 60 by soldering or the like.

Subsequently, a first resin material is applied to the one main surface 60a of the mount substrate 60 so as to cover the element d1 and the first resin material is cured (S22). As a result of curing the first resin material, the first resin portion is provided so as to enclose the element substrate 10, the functional electrode 21, and the extended wiring lines 221 and 222 and to further enclose the cover layer 40, the second resin portion 32, and the third resin portion 33 on the outer side thereof. Accordingly, the acoustic wave device 1 as illustrated in FIG. 1 is formed.

1-3. Advantages or the Like

In the acoustic wave device 1 having the above-described configuration, it is possible to prevent a break in the extended wiring lines 221a and 222a provided on the side surfaces 10c of the element substrate 10. To facilitate the understanding of this, the configuration of an acoustic wave device according to a comparative example will be described.

Figure 14:
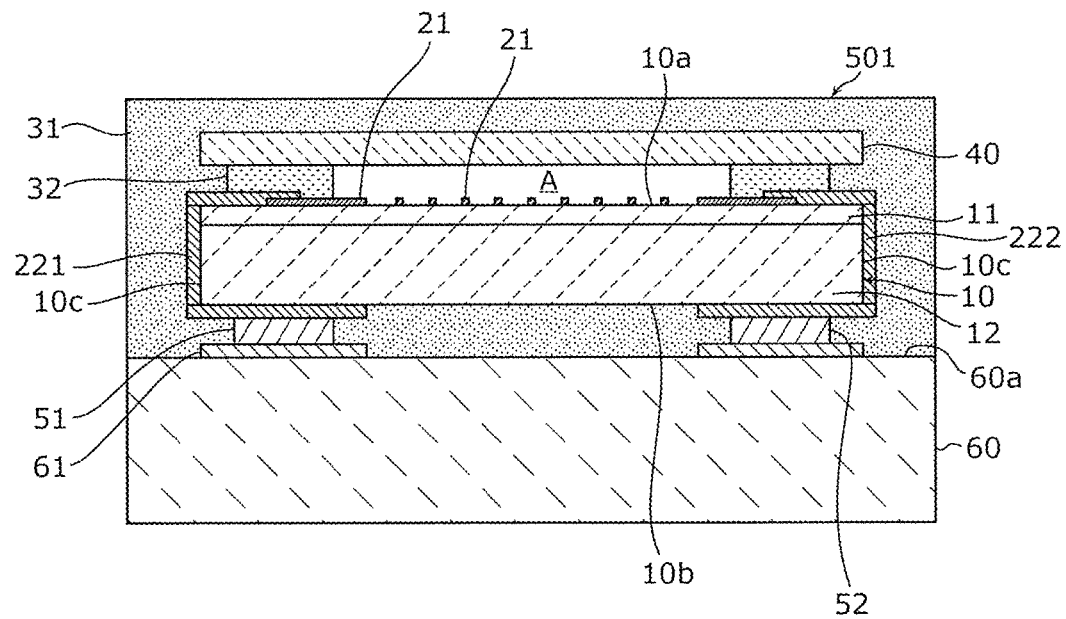
FIG. 14 is a cross-sectional view illustrating an acoustic wave device according to a comparative example.

FIG. 14 is a cross-sectional view illustrating an acoustic wave device 501 according to the comparative example. The acoustic wave device 501 according to the comparative example includes the element substrate 10; the functional electrode 21 and the extended wiring lines 221 and 222 that are provided on the element substrate 10; the cover layer 40 that covers the functional electrode 21; the external terminal 51 connected to the extended wiring line 221; and the external terminal 52 connected to the second extended wiring line 222. In addition, the acoustic wave device 501 includes the second resin portion 32 supporting the cover layer 40; and the first resin portion 31 that encloses the whole of the element substrate 10, the extended wiring lines 221 and 222, and the cover layer 40.

In the acoustic wave device 501 according to the comparative example, the extended wiring lines 221 and 222 on the side surfaces 10c are not covered by the second resin portion 32, and the first resin portion 31 is in contact with the extended wiring lines 221 and 222. Thus, in the acoustic wave device 501, when an external force is added thereto, the force is transmitted to the extended wiring lines 221 and 222 on the side surfaces 10c through the first resin portion 31, and the extended wiring lines 221 and 222 are likely to break.

In contrast, the acoustic wave device 1 according to this preferred embodiment has the following configuration. That is, the acoustic wave device 1 includes the element substrate 10 that includes the first main surface 10a and the second main surface 10b facing away from each other and the side surfaces connecting the first main surface 10a and the second main surface 10b to each other and that has piezoelectricity at least partially, the functional electrode 21 that is provided on the first main surface 10a of the element substrate 10, the extended wiring lines 221a and 222a that are electrically connected to the functional electrode 21 and that extend from the first main surface 10a to the side surfaces 10c of the element substrate 10; the external terminals 51 and 52 that are electrically connected to the extended wiring lines 221a and 222a and that are provided directly or indirectly on the second main surface 10b of the element substrate 10, the first resin portion 31 that seals the acoustic wave device 1, and the second resin portion 32 that is provided at least between the extended wiring lines 221a and 222a provided on the side surfaces 10c and the first resin portion 31. The second resin portion 32 has a lower Young's modulus than the first resin portion 31.

With this structure in which the second resin portion 32 is provided between the first resin portion 31 and the extended wiring lines 221a and 222a and the second resin portion 32 has a lower Young's modules than the first resin portion 31, the force to be added to the extended wiring lines 221a and 222a can be reduced when an external force is added to the acoustic wave device 1. Accordingly, it is possible to prevent a break in the extended wiring lines 221a and 222a provided on the side surfaces 10c of the element substrate 10.

In addition, the acoustic wave device 1 according to this preferred embodiment includes the element substrate 10, the functional electrode 21, the extended wiring lines 221a and 222a, the first resin portion 31, and the second resin portion 32 provided between the first resin portion 31 and the extended wiring lines 221a and 222a. The second resin portion 32 has a lower filler content than the first resin portion 31.

With this structure in which the second resin portion 32 is provided between the first resin portion 31 and the extended wiring lines 221a and 222a and the second resin portion 32 has a lower filler content than the first resin portion 31, the force to be added to the extended wiring lines 221a and 222a can be reduced when an external force is added to the acoustic wave device 1. Accordingly, it is possible to prevent a break in the extended wiring lines 221a and 222a provided on the side surfaces 10c of the element substrate 10.

In addition, with the structure in which the second resin portion 32 is provided between the first resin portion 31 and the extended wiring lines 221 and 222 at the first corner portions 16 or the second corner portions 17, the force to be added to the extended wiring lines 221 and 222 can be reduced when an external force is added to the acoustic wave device 1. Accordingly, it is possible to prevent a break in the extended wiring lines 221 and 222 provided at the corner portions of the element substrate 10.

1-4. First Modification Example of First Preferred Embodiment

Figure 8:
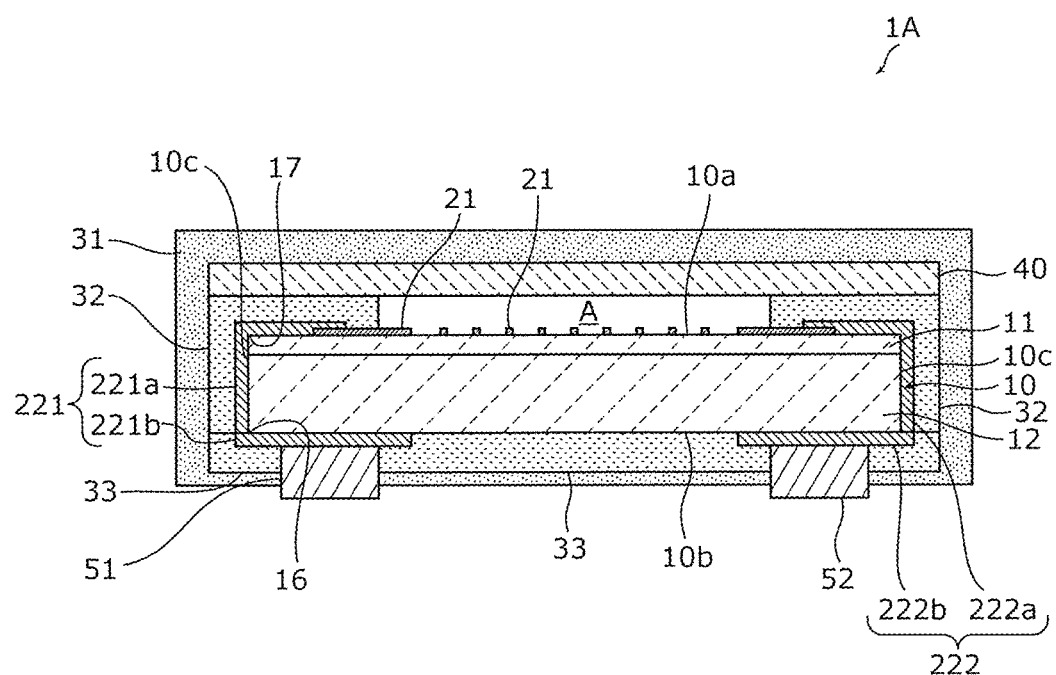
FIG. 8 is a cross-sectional view illustrating an acoustic wave device according to a first modification example of the first preferred embodiment of the present invention.

FIG. 8 is a cross-sectional view illustrating an acoustic wave device 1A according to a first modification example of the first preferred embodiment. FIG. 8 illustrates the acoustic wave device 1A that is to be mounted on the mount substrate 60. In the acoustic wave device 1A, the first resin portion 31 is not provided on the mount substrate 60 but is provided only to the acoustic wave device 1A, which is different from the first preferred embodiment in which the first resin portion 31 is provided on the mount substrate 60. Such a first resin portion 31 can be formed by, for example, printing, immersion, or the like.

Also in the acoustic wave device 1A according to the first modification example, the second resin portion 32 is provided between the first resin portion 31 and the extended wiring lines 221a and 222a, and the second resin portion 32 has a lower Young's modulus than the first resin portion 31. In addition, in the acoustic wave device 1A, the second resin portion 32 has a lower filler content than the first resin portion 31. Thus, when an external force is added to the acoustic wave device 1A, the force to be added to the extended wiring lines 221a and 222a can be reduced. Accordingly, it is possible to prevent a break in the extended wiring lines 221a and 222a provided on the side surfaces 10c of the element substrate 10.

1-5. Second Modification Example of First Preferred Embodiment

Figure 9:
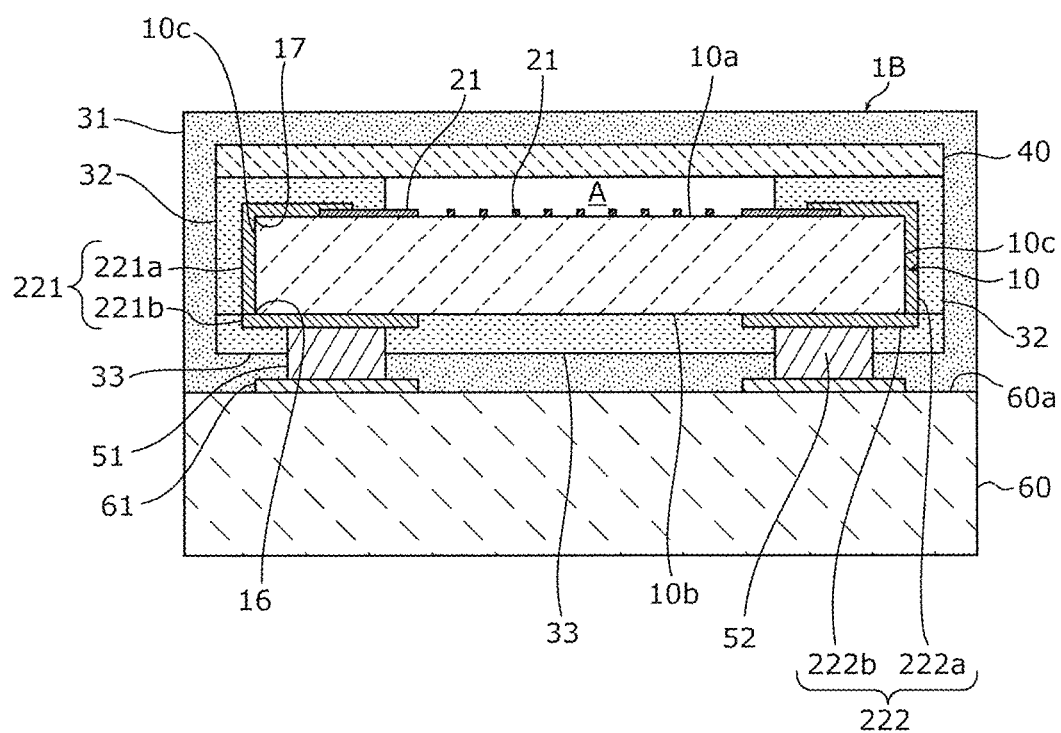
FIG. 9 is a cross-sectional view illustrating an acoustic wave device according to a second modification example of the first preferred embodiment of the present invention.

FIG. 9 is a cross-sectional view illustrating an acoustic wave device 1B according to a second modification example of the first preferred embodiment. In the acoustic wave device 1B illustrated in FIG. 9, the element substrate 10 includes only a piezoelectric layer, which is different from the first preferred embodiment in which the element substrate 10 includes the supporting substrate 12 and the piezoelectric layer 11.

Also in the acoustic wave device 1B according to the second modification example, the second resin portion 32 is provided between the first resin portion 31 and the extended wiring lines 221a and 222a, and the second resin portion 32 has a lower Young's modulus than the first resin portion 31. In addition, in the acoustic wave device 1B, the second resin portion 32 has a lower filler content than the first resin portion 31. Thus, when an external force is added to the acoustic wave device 1B, the force to be added to the extended wiring lines 221a and 222a can be reduced. Accordingly, it is possible to prevent a break in the extended wiring lines 221a and 222a provided on the side surfaces 10c of the element substrate 10.

1-6. Third Modification Example of First Preferred Embodiment

Figure 10:
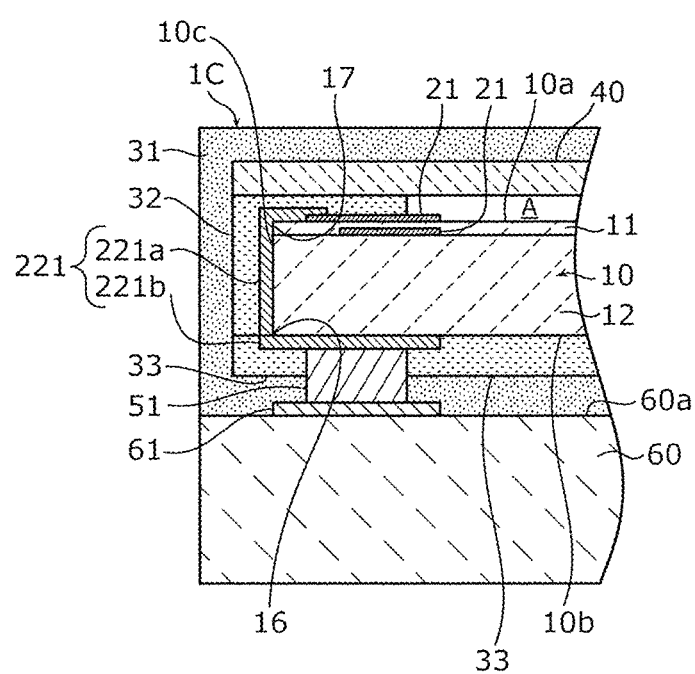
FIG. 10 is a cross-sectional view illustrating an acoustic wave device according to a third modification example of the first preferred embodiment of the present invention.

FIG. 10 is a cross-sectional view illustrating an acoustic wave device 1C according to a third modification example of the first preferred embodiment. In the acoustic wave device 1C illustrated in FIG. 10, the functional electrode 21 is provided between the supporting substrate 12 and the piezoelectric layer 11 and on the piezoelectric layer 11, which is different from the first preferred embodiment in which the functional electrode 21 is not present between the supporting substrate 12 and the piezoelectric layer 11. Each of the extended wiring lines 221a and 222a is connected to the functional electrode 21 on the piezoelectric layer 11, that is, on the first main surface 10a.

Also in the acoustic wave device 1C according to the third modification example, the second resin portion 32 is provided between the first resin portion 31 and the extended wiring lines 221a and 222a, and the second resin portion 32 has a lower Young's modulus than the first resin portion 31. In addition, in the acoustic wave device 1C, the second resin portion 32 has a lower filler content than the first resin portion 31. Thus, when an external force is added to the acoustic wave device 1C, the force to be added to the extended wiring lines 221a and 222a can be reduced. Accordingly, it is possible to prevent a break in the extended wiring lines 221a and 222a provided on the side surfaces 10c of the element substrate 10.

1-7. Fourth Modification Example of First Preferred Embodiment

Figure 11:
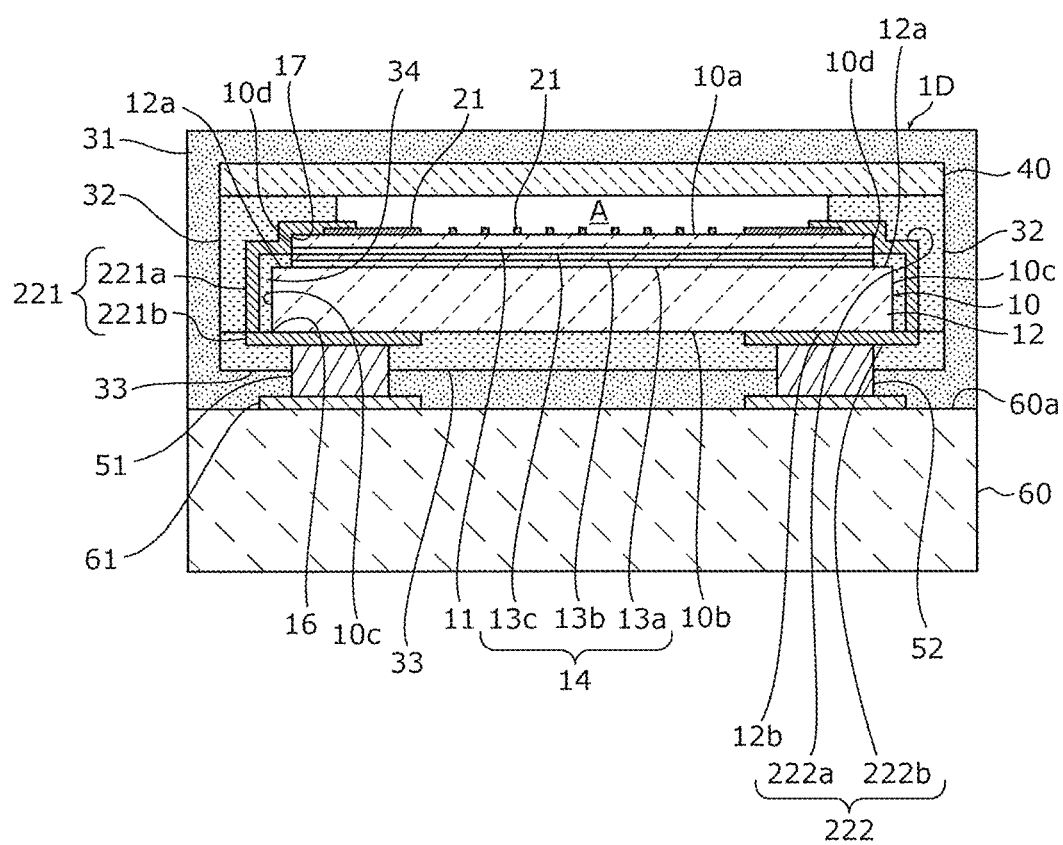
FIG. 11 is a cross-sectional view illustrating an acoustic wave device according to a fourth modification example of the first preferred embodiment of the present invention.

FIG. 11 is a cross-sectional view illustrating an acoustic wave device 1D according to a fourth modification example of the first preferred embodiment. In the acoustic wave device 1D according to the fourth modification example, the element substrate 10 includes the supporting substrate 12 including a silicon material, an intermediate layer 14 provided on the supporting substrate 12, and the piezoelectric layer 11 provided on the intermediate layer 14, which is different from the first preferred embodiment in which the element substrate 10 includes the supporting substrate 12 and the piezoelectric layer 11. The piezoelectric layer 11 of the acoustic wave device 1D is provided indirectly on the supporting substrate 12. The supporting substrate 12 includes another main surface 12b, which is the same as the second main surface 10b of the element substrate 10, and one main surface 12a opposite to the other main surface 12b.

The intermediate layer 14 includes a higher-order mode leakage layer 13a, a high-acoustic-velocity film 13b, and a low-acoustic-velocity film 13c. Specifically, the higher-order mode leakage layer 13a, which includes a film that prevents leakage of a higher-order mode, is laminated on the supporting substrate 12, the high-acoustic-velocity film 13b having a relatively high acoustic velocity is laminated on the higher-order mode leakage layer 13a, the low-acoustic-velocity film 13c having a relatively low acoustic velocity is laminated on the high-acoustic-velocity film 13b, and the piezoelectric layer 11 is laminated on the low-acoustic-velocity film 13c. An appropriate material may be provided between the intermediate layer 14 and the supporting substrate 12.

The higher-order mode leakage layer 13a can be formed by using an appropriate material that prevents leakage of a higher-order mode. Silicon oxide or the like may be used as such a material.

The high-acoustic-velocity film 13b has a function of confining an acoustic wave within a portion where the piezoelectric layer 11 and the low-acoustic-velocity film 13c are laminated so as to prevent the acoustic wave from being leaked below the high-acoustic-velocity film 13b. The high-acoustic-velocity film 13b is made of, for example, aluminum nitride. As long as the acoustic wave can be confined, various high-acoustic-velocity materials may be used, such as aluminum nitride, aluminum oxide, silicon carbide, silicon nitride, silicon oxynitride, a DLC film or diamond, a medium mainly including any of these materials, or a medium mainly including a mixture of these materials. To confine the acoustic wave within the portion where the piezoelectric layer 11 and the low-acoustic-velocity film 13c are laminated, the high-acoustic-velocity film 13b is preferably as thick as possible, and preferably has a thickness that is about 0.1 times or more the wavelength λ of the acoustic wave, furthermore, about 1.5 times or more the wavelength λ of the acoustic wave.

The low-acoustic-velocity film 13c is made of silicon oxide. As the material of the low-acoustic-velocity film 13c, an appropriate material having an acoustic velocity of a bulk wave lower than that of a bulk wave that propagates through the piezoelectric layer 11 may be used. Examples of such a material include silicon oxide, glass, silicon oxynitride, tantalum oxide, and a medium mainly including any of the above materials, such as a compound obtained by adding fluorine, carbon, or boron to silicon oxide.

The high-acoustic-velocity film 13b is a film in which the acoustic velocity of a bulk wave in the high-acoustic-velocity film 13b is higher than that of a surface acoustic wave or a boundary acoustic wave that propagates through the piezoelectric layer 11. The low-acoustic-velocity film 13c is a film in which the acoustic velocity of a bulk wave in the low-acoustic-velocity film 13c is lower than that of a bulk wave that propagates through the piezoelectric layer 11.

With the higher-order mode leakage layer 13a, the high-acoustic-velocity film 13b, and the low-acoustic-velocity film 13c being disposed between the piezoelectric layer 11 and the supporting substrate 12, a Q value can be increased.

In the acoustic wave device 1D, the piezoelectric layer 11 and the intermediate layer 14 have a smaller outer shape than the supporting substrate 12 when viewed from a direction perpendicular to the second main surface 10b, and side surfaces 10d of the piezoelectric layer 11 and the intermediate layer 14 are located on inner sides of the side surfaces 10c of the element substrate 10 when viewed in a cross section. For example, with the side surfaces 10d of the piezoelectric layer 11 and the intermediate layer 14 being disposed on inner sides of the side surfaces 10c of the element substrate 10, the piezoelectric layer and the intermediate layer 14 can be prevented from being touched by a dicing blade during the step of cutting the mother substrate into pieces by using the dicing blade (see part (b) of FIG. 7), and cracking or interfacial delamination of the piezoelectric layer 11 and the intermediate layer 14 can be prevented.

The individual extended wiring lines 221a and 222a extend from the first main surface 10a along the side surfaces 10d of the piezoelectric layer 11 and the intermediate layer 14, the one main surface 12a of the supporting substrate 12, and the side surfaces 10c.

Also in the acoustic wave device 1D according to the fourth modification example, the second resin portion 32 is provided between the first resin portion 31 and the extended wiring lines 221a and 222a, and the second resin portion 32 has a lower Young's modulus than the first resin portion 31. In addition, in the acoustic wave device 1D, the second resin portion 32 has a lower filler content than the first resin portion 31. Thus, when an external force is added to the acoustic wave device 1D, the force to be added to the extended wiring lines 221a and 222a can be reduced. Accordingly, it is possible to prevent a break in the extended wiring lines 221a and 222a provided on the side surfaces 10c of the element substrate 10.

In addition, in the acoustic wave device 1D, a fourth resin portion 34 is provided on the side surfaces 10c of the element substrate 10 and the one main surface 12a of the supporting substrate 12. That is, the fourth resin portion 34 is provided between the side surfaces 10c of the element substrate 10 and the one main surface 12a of the supporting substrate 12, and the extended wiring lines 221a and 222a.

For example, in a case where the side surfaces 10c of the element substrate 10 are in contact with the extended wiring lines 221a and 222a, a leak current is likely to flow into the supporting substrate 12. In contrast, in a case where the fourth resin portion 34 is provided between the side surfaces 10c of the element substrate 10 and the extended wiring lines 221a and 222a as in the acoustic wave device 1D, it is possible to prevent flowing of a leak current into the supporting substrate 12.

In this preferred embodiment, the element substrate 10 may have the following multilayer structure.

The element substrate 10 includes the supporting substrate 12, the intermediate layer 14 provided on the supporting substrate 12, and the piezoelectric layer 11 provided on the intermediate layer 14. The piezoelectric layer 11 is provided indirectly on the supporting substrate 12.

The supporting substrate 12 includes the one main surface 12a and the other main surface 12b that face away from each other. The supporting substrate 12 is made of a material in which the acoustic velocity of a bulk wave that propagates therethrough is higher than the acoustic velocity of an acoustic wave that propagates through the piezoelectric layer 11. Examples of the material of the supporting substrate 12 include semiconductor such as Si, sapphire, $LiTaO_3$ (hereinafter referred to as "LT"), $LiNbO_3$ (hereinafter referred to as "LN"), glass, and the like. These materials may be used alone, or a plurality of them may be used in combination.

The intermediate layer 14 is provided on the one main surface 12a of the supporting substrate 12. The intermediate layer 14 is located immediately below the piezoelectric layer 11 and is in contact with the piezoelectric layer 11. The intermediate layer 14 that is in contact with the piezoelectric layer 11 prevents the energy of an acoustic wave propagating through the piezoelectric layer 11 from leaking in the thickness direction.

The intermediate layer 14 is made of a material in which the acoustic velocity of a bulk wave that propagates therethrough is lower than the acoustic velocity of an acoustic wave that propagates through the piezoelectric layer 11. The intermediate layer 14 includes, for example, a polycrystalline, amorphous, or uniaxially oriented film, and has crystal grains and grain boundaries.

Specifically, the intermediate layer 14 includes an $SiO_2$ layer. As the material of the intermediate layer 14, silicon nitride, aluminum nitride, or the like may be used instead of $SiO_2$. These materials may be used alone, or a plurality of them may be used in combination. From the viewpoint of increasing the adhesion with the supporting substrate 12, it is desirable to use $SiO_2$ as the material of the intermediate layer 14.

The piezoelectric layer 11 is provided on the intermediate layer 14. The piezoelectric layer 11 is a thin film. Preferably, the piezoelectric layer 11 has a thickness of, for example, about 3.5λ or less, where λ represents the wavelength of an acoustic wave. In this case, the acoustic wave can be excited more. The piezoelectric layer 11 is made of LT. As the material of the piezoelectric layer 11, another piezoelectric single crystal, such as LN, or piezoelectric ceramics may be used.

1-8. Fifth Modification Example of First Preferred Embodiment

Figure 12:
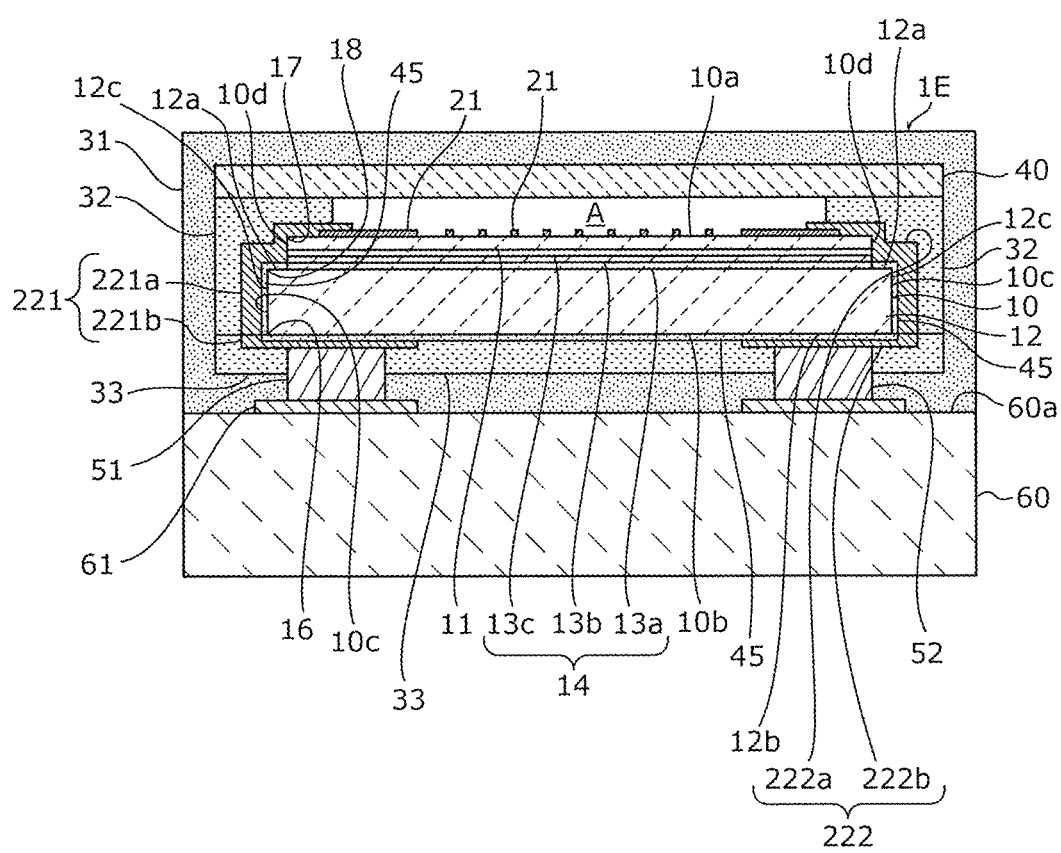
FIG. 12 is a cross-sectional view illustrating an acoustic wave device according to a fifth modification example of the first preferred embodiment of the present invention.

FIG. 12 is a cross-sectional view illustrating an acoustic wave device 1E according to a fifth modification example of the first preferred embodiment. In the acoustic wave device 1E according to the fifth modification example, an insulating layer 45 is provided between the one main surface 12a, the other main surface 12b, and side surfaces 12c of the supporting substrate 12 and the individual extended wiring lines 221 and 222, which is different from the first preferred embodiment in which the insulating layer 45 is not provided.

The element substrate 10 of the acoustic wave device 1E includes the supporting substrate 12 including a silicon material, the intermediate layer 14 provided on the supporting substrate 12, and the piezoelectric layer 11 provided on the intermediate layer 14.

In the acoustic wave device 1E, the piezoelectric layer 11 and the intermediate layer 14 have a smaller outer shape than the supporting substrate 12 when viewed from a direction perpendicular to the first main surface 10a, and the side surfaces 10d of the piezoelectric layer 11 and the intermediate layer 14 are located on inner sides of the side surfaces 10c of the element substrate 10 when viewed in a cross section. For example, with the side surfaces 10d of the piezoelectric layer 11 and the intermediate layer 14 being disposed on inner sides of the side surfaces 10c of the element substrate 10, the piezoelectric layer and the intermediate layer 14 can be prevented from being touched by a dicing blade during the step of cutting the mother substrate into pieces by using the dicing blade (see part (b) of FIG. 7), and cracking or interfacial delamination of the piezoelectric layer 11 and the intermediate layer 14 can be prevented.

The element substrate 10 having the above-described structure has a protruded shape in the cross section. Specifically, the element substrate 10 includes the first main surface 10a, the second main surface 10b, the side surfaces 10c, and the side surfaces 10d. The side surfaces 10c adjoin the second main surface 10b and are connected to the second main surface 10b. The side surfaces 10d adjoin the first main surface 10a and are connected to the first main surface 10a. The side surfaces 10d of the element substrate 10 herein are the same as the side surfaces 10d of the piezoelectric layer 11 and the intermediate layer 14 described above. The supporting substrate 12 of the element substrate 10 includes the one main surface 12a, the other main surface 12b, and the side surfaces 12c. The other main surface 12b of the supporting substrate 12 is the same as the second main surface 10b, and the side surfaces 12c of the supporting substrate 12 are the same as the side surfaces 10c. The one main surface 12a of the supporting substrate 12 adjoins both the side surfaces 10d and the side surfaces 10c, and a portion of the one main surface 12a connects the side surfaces 10d and the side surfaces 10c. The side surfaces 10c and 12c may be inclined with respect to the first main surface 10a or the second main surface 10b. The first main surface 10a, the second main surface 10b, and the one main surface 12a need not necessarily be parallel to each other.

In addition, the element substrate 10 includes the first corner portions 16, which are portions at which the second main surface 10b and the side surfaces 10c adjoin each other, the second corner portions 17, which are portions at which the first main surface 10a and the side surfaces 10d adjoin each other, and third corner portions 18, which are portions at which the one main surface 12a and the side surfaces 10c adjoin each other.

The individual extended wiring lines 221a and 222a are provided along the side surfaces 10d of the piezoelectric layer 11 and the paths that connect the side surfaces 10d of the piezoelectric layer 11 and the side surfaces 10c of the element substrate 10. More specifically, the individual extended wiring lines 221a and 222a are provided in a stepwise manner from the first main surface 10a along the second corner portions 17, the side surfaces 10d, the one main surface 12a, the third corner portions 18, and the side surfaces 10c. The extended wiring lines 221a and 222a are provided along a surface not provided with the piezoelectric layer 11 or the intermediate layer 14 of the one main surface 12a of the supporting substrate 12. The extended wiring lines 221b and 222b are connected to the end portions of the extended wiring lines 221a and 222a provided along the side surfaces 10c, respectively, and are provided along the first corner portions 16 and the second main surface 10b. Note that the extended wiring lines 221a and 221b and the extended wiring lines 222a and 222b according to this preferred embodiment are not in contact with the supporting substrate 12.

In the acoustic wave device 1E according to this preferred embodiment, the insulating layer 45 is provided on the one main surface 12a, the other main surface 12b, and the side surfaces 12c of the supporting substrate 12. Specifically, the insulating layer 45 is provided between the one main surface 12a of the supporting substrate 12 and the extended wiring lines 221a and 222a and between the side surfaces 12c and the extended wiring lines 221a and 222a. In addition, the insulating layer 45 is provided between the other main surface 12b of the supporting substrate 12 and the extended wiring lines 221b and 222b. The insulating layer 45 is made of, for example, a material such as silicon oxide (SiO$_2$) or silicon nitride (SiN). The insulating layer 45 may be provided on the entire one main surface 12a, the entire other main surface 12b, and the entire side surfaces 12c.

With the insulating layer 45 being provided between the supporting substrate 12 including a silicon material and the extended wiring lines 221 and 222, the extended wiring lines 221 and 222 are not in contact with the supporting substrate 12. For example, in a case where the supporting substrate 12 is in contact with the extended wiring lines 221 and 222, a leak current is likely to flow into the supporting substrate 12 including a silicon material. In contrast, as a result of providing the insulating layer 45 between the supporting substrate 12 and the extended wiring lines 221 and 222 as in the acoustic wave device 1E, it is possible to prevent flowing of a leak current into the supporting substrate 12 including a silicon material, and it is possible to prevent degradation of characteristics of the acoustic wave device 1E.

The acoustic wave device 1E according to this preferred embodiment includes the element substrate 10 that includes the first main surface 10a, the second main surface 10b facing away from the first main surface 10a, and the side surfaces 10c connecting the first main surface 10a and the second main surface 10b and that contains a silicon material at least partially; the functional electrode 21 provided on the first main surface 10a of the element substrate 10; the extended wiring lines 221 and 222 that are provided so as to be electrically connected to the functional electrode 21 and to extend from the first main surface 10a to the side surfaces 10c; and the insulating layer 45 provided between the element substrate 10 and the extended wiring lines 221 and 222 on outer sides of the side surfaces 10c. As a result of providing the insulating layer 45 between the side surfaces 10c of the element substrate 10 and the extended wiring lines 221 and 222 in this manner, it is possible to prevent flowing of a leak current into the element substrate 10 including a silicon material.

In addition, the extended wiring lines 221 and 222 are provided so as to extend from the side surfaces 10c to the second main surface 10b, and the insulating layer 45 is provided between the element substrate 10 and the individual extended wiring lines 221 and 222 on an outer side of the second main surface 10b. As a result of providing the insulating layer 45 between the second main surface 10b of the element substrate 10 and the extended wiring lines 221 and 222 in this manner, it is possible to prevent flowing of a leak current into the element substrate 10 including a silicon material.

In addition, the element substrate 10 includes the supporting substrate 12 that includes the other main surface 12b, which is the same as the second main surface 10b, and the one main surface 12a facing away from the other main surface 12b and that contains a silicon material; and the piezoelectric layer 11 located above the one main surface 12a of the supporting substrate 12. The side surfaces 10d of the piezoelectric layer 11 are located on inner sides of the side surfaces 10c of the element substrate 10. The extended wiring lines 221 and 222 are provided along the side surfaces 10d of the piezoelectric layer 11 and the paths that connect the side surfaces 10d of the piezoelectric layer 11 and the side surfaces 10c of the element substrate 10 and that correspond to at least a portion of the one main surface 12a of the supporting substrate 12. The insulating layer 45 is provided between the supporting substrate 12 and the extended wiring lines 221 and 222 on an outer side of the one main surface 12a. As a result of providing the insulating layer 45 between the one main surface 12a of the supporting substrate 12 and the individual extended wiring lines 221 and 222 in this manner, it is possible to prevent flowing of a leak current into the supporting substrate 12 including a silicone material.

In this preferred embodiment, the intermediate layer 14 has the following multilayer structure.

The intermediate layer 14 includes the higher-order mode leakage layer 13a, the high-acoustic-velocity film 13b, and the low-acoustic-velocity film 13c. Specifically, the higher-order mode leakage layer 13a, which includes a film that prevents leakage of a higher-order mode, is laminated on the supporting substrate 12, the high-acoustic-velocity film 13b having a relatively high acoustic velocity is laminated on the higher-order mode leakage layer 13a, the low-acoustic-velocity film 13c having a relatively low acoustic velocity is laminated on the high-acoustic-velocity film 13b, and the piezoelectric layer 11 is laminated on the low-acoustic-velocity film 13c. An appropriate material may be provided between the intermediate layer 14 and the supporting substrate 12.

The higher-order mode leakage layer 13a can be formed by using an appropriate material that prevents leakage of a higher-order mode. Silicon oxide or the like may be used as such a material.

The high-acoustic-velocity film 13b has a function of confining an acoustic wave within a portion where the piezoelectric layer 11 and the low-acoustic-velocity film 13c are laminated so as to prevent the acoustic wave from being leaked below the high-acoustic-velocity film 13b. The high-acoustic-velocity film 13b is made of, for example, aluminum nitride. As long as the acoustic wave can be confined, various high-acoustic-velocity materials may be used, such as aluminum nitride, aluminum oxide, silicon carbide, silicon nitride, silicon oxynitride, a DLC film or diamond, a medium mainly including any of these materials, or a medium mainly including a mixture of these materials. To confine the acoustic wave within the portion where the piezoelectric layer 11 and the low-acoustic-velocity film 13c are laminated, the high-acoustic-velocity film 13b is preferably as thick as possible, and preferably has a thickness that is about 0.1 times or more the wavelength λ of the acoustic wave, furthermore, about 1.5 times or more the wavelength λ of the acoustic wave.

The low-acoustic-velocity film 13c is made of silicon oxide. As the material of the low-acoustic-velocity film 13c, an appropriate material having an acoustic velocity of a bulk wave lower than that of a bulk wave that propagates through the piezoelectric layer 11 may be used. Examples of such a material include silicon oxide, glass, silicon oxynitride, tantalum oxide, and a medium mainly including any of the above materials, such as a compound obtained by adding fluorine, carbon, or boron to silicon oxide.

The high-acoustic-velocity film 13b is a film in which the acoustic velocity of a bulk wave in the high-acoustic-velocity film 13b is higher than that of a surface acoustic wave or a boundary acoustic wave that propagates through the piezoelectric layer 11. The low-acoustic-velocity film 13c is a film in which the acoustic velocity of a bulk wave in the low-acoustic-velocity film 13c is lower than that of a bulk wave that propagates through the piezoelectric layer 11.

With the higher-order mode leakage layer 13a, the high-acoustic-velocity film 13b, and the low-acoustic-velocity film 13c being disposed between the piezoelectric layer 11 and the supporting substrate 12, a Q value can be increased.

1-9. Other Modification Examples of First Preferred Embodiment

Other modification examples will be described. For example, in the first preferred embodiment, the element substrate 10 includes the piezoelectric layer 11 and the supporting substrate 12, but the preferred embodiments are not limited thereto. The element substrate 10 may be defined by a single object and may be made of, for example, a piezoelectric ceramic material.

In the first preferred embodiment, the electrode structure on the first main surface 10a of the element substrate 10 is not particularly limited, and the functional electrode 21 need not necessarily include a reflector. It is sufficient that the functional electrode 21 have at least an electrode structure that excites an acoustic wave.

Second Preferred Embodiment

Figure 13:
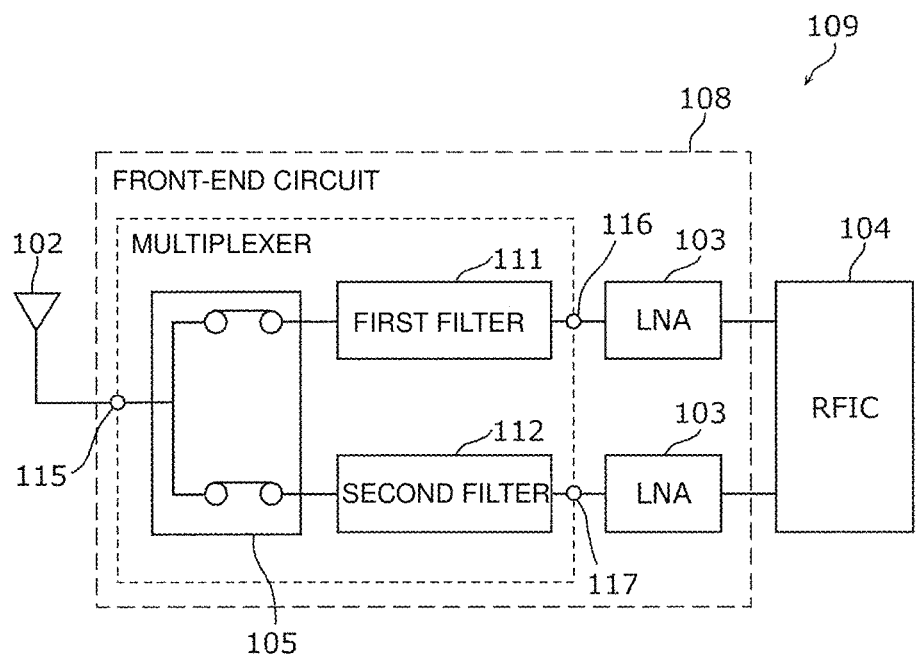
FIG. 13 is a circuit configuration diagram illustrating a front-end circuit and a communication apparatus according to a second preferred embodiment of the present invention.

Next, a description will be given of a front-end circuit 108 and a communication apparatus 109 according to a second preferred embodiment of the present invention. FIG. 13 is a circuit configuration diagram illustrating the front-end circuit 108 and the communication apparatus 109 according to the second preferred embodiment.

In the front-end circuit 108 and the communication apparatus 109, a first filter 111 and a second filter 112 each include the acoustic wave device 1 according to the first preferred embodiment.

In the front-end circuit 108 and the communication apparatus 109 illustrated in FIG. 13, to amplify a signal input thereto, a low noise amplifier (LNA) 103 is provided between a first terminal 116 and an RFIC 104, and an LNA 103 is provided between a second terminal 117 and the RFIC 104. In addition, to switch the connection state with an antenna element 102, a multi-port switch 105 is provided between the first filter 111 and an antenna common terminal 115 and between the second filter 112 and the antenna common terminal 115. The multi-port switch 105 is a switch that can be turned ON/OFF simultaneously, and enables the second filter 112 to be connected to the antenna common terminal 115 when the first filter 111 is connected to the antenna common terminal 115, that is, when the first filter 111 is performing signal processing.

Also in the front-end circuit 108 and the communication apparatus 109 having the above-described circuit configuration, it is possible to prevent a break in the extended wiring lines on the side surfaces of the element substrate of the acoustic device as in the first preferred embodiment.

In the second preferred embodiment, the first filter 111 defines and functions as a reception filter, but the preferred embodiments are not limited thereto. The first filter 111 including the acoustic wave device 1 may be used as a transmission filter. For example, the LNA 103 located between the first filter 111 defining and functioning as a transmission filter and the RFIC 104 may be replaced with a power amplifier (PA), and accordingly the communication apparatus 109 capable of performing transmission and reception can be formed.

Each filter of the front-end circuit 108 and the communication apparatus 109 is not limited to a surface acoustic wave filter and may be a boundary acoustic wave filter. Also with this configuration, advantageous effects similar to the advantageous effects of the acoustic wave device 1 according to the above-described preferred embodiments and so forth can be produced.

Other Preferred Embodiments

A description has been given of the acoustic wave devices 1 to 1E, the front-end circuit 108, and the communication apparatus 109 according to the present invention on the basis of the preferred embodiments and modification examples. The present invention is not limited to the above-described preferred embodiments and modification examples. Another preferred embodiment implemented by combining arbitrary components according to the above-described preferred embodiments and modification examples, a modification example obtained by applying, to the above-described preferred embodiments, various changes conceived of by a person skilled in the art without deviating from the gist of the present invention, and various apparatuses incorporating an acoustic wave device according to the present invention are included in the present invention.

Acoustic wave devices according to preferred embodiments of the present invention are widely applicable to various electronic apparatuses or communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
an element substrate that includes a first main surface and a second main surface facing away from each other and a side surface connecting the first main surface and the second main surface to each other and that has piezoelectricity at least partially;
a functional electrode that is provided on the first main surface of the element substrate;
an extended wiring line that is electrically connected to the functional electrode and that extends from the first main surface to the side surface of the element substrate;
an external terminal that is electrically connected to the extended wiring line and that is provided directly or indirectly on the second main surface of the element substrate;
a first resin portion that seals the acoustic wave device;
a second resin portion that is provided at least between the extended wiring line provided on the side surface and the first resin portion; and
a third resin portion; wherein
the second resin portion has a lower Young's modulus than the first resin portion;
the element substrate includes a first corner portion that is a portion at which the second main surface adjoins the side surface;
the extended wiring line extends from the side surface to the first corner portion and the second main surface; and
the third resin portion is provided at least between the extended wiring line provided at the first corner portion and the first resin portion, and has a lower Young's modulus than the first resin portion.

2. The acoustic wave device according to claim 1, further comprising a cover layer, wherein
the functional electrode includes an IDT electrode;
the second resin portion is provided around the IDT electrode in a direction along the first main surface; and
the cover layer is provided on the second resin portion so as to cover the IDT electrode in a direction perpendicular or substantially perpendicular to the first main surface.

3. The acoustic wave device according to claim 1, further comprising an insulating layer, wherein
the element substrate includes at least a supporting substrate including a silicon material and a piezoelectric layer that is provided directly or indirectly on the supporting substrate; and
the insulating layer is provided between the extended wiring line and the supporting substrate.

4. The acoustic wave device according to claim 1, wherein
the element substrate includes at least a supporting substrate and a piezoelectric layer that is provided directly or indirectly on the supporting substrate;
when the element substrate is viewed in a cross section from a direction perpendicular to the first main surface, a side surface of the piezoelectric layer is located on an inner side of the side surface of the element substrate; and
the extended wiring line extends from the second main surface to the side surface of the piezoelectric layer and the side surface of the element substrate.

5. The acoustic wave device according to claim 1, wherein
the element substrate includes a supporting substrate and a piezoelectric layer that is provided directly on the supporting substrate;
the functional electrode is provided on the piezoelectric layer; and
an acoustic velocity of a bulk wave that propagates through the supporting substrate is higher than an acoustic velocity of an acoustic wave that propagates through the piezoelectric layer.

6. The acoustic wave device according to claim 1, wherein
the element substrate includes a supporting substrate, a piezoelectric layer that is provided indirectly on the supporting substrate, and an intermediate layer that is provided between the supporting substrate and the piezoelectric layer;

the functional electrode is provided on the piezoelectric layer;
an acoustic velocity of a bulk wave that propagates through the intermediate layer is lower than an acoustic velocity of an acoustic wave that propagates through the piezoelectric layer; and
an acoustic velocity of a bulk wave that propagates through the supporting substrate is higher than the acoustic velocity of the acoustic wave that propagates through the piezoelectric layer.

7. The acoustic wave device according to claim 1, wherein
the element substrate includes a supporting substrate, a piezoelectric layer that is provided indirectly on the supporting substrate, and an intermediate layer that is provided between the supporting substrate and the piezoelectric layer;
the functional electrode is provided on the piezoelectric layer;
the intermediate layer includes a low-acoustic-velocity film in which an acoustic velocity of a bulk wave that propagates therethrough is lower than an acoustic velocity of an acoustic wave that propagates through the piezoelectric layer, and a high-acoustic-velocity film in which an acoustic velocity of a bulk wave that propagates therethrough is higher than the acoustic velocity of the acoustic wave that propagates through the piezoelectric layer;
the low-acoustic-velocity film is provided between the piezoelectric layer and the supporting substrate; and
the high-acoustic-velocity film is provided between the low-acoustic-velocity film and the supporting substrate.

8. The acoustic wave device according to claim 1, wherein
the element substrate is bonded to one main surface of a mount substrate with the external terminal interposed therebetween; and
the first resin portion covers the one main surface of the mount substrate.

9. A front-end circuit comprising:
the acoustic wave device according to claim 1.

10. A communication apparatus comprising:
the front-end circuit according to claim 9; and
a signal processing circuit that processes a high-frequency signal.

11. An acoustic wave device comprising:
an element substrate that includes a first main surface and a second main surface facing away from each other and a side surface connecting the first main surface and the second main surface to each other and that has piezoelectricity at least partially;
a functional electrode that is provided on the first main surface of the element substrate;
an extended wiring line that is electrically connected to the functional electrode and that extends from the first main surface to the side surface of the element substrate;
an external terminal that is electrically connected to the extended wiring line and that is provided directly or indirectly on the second main surface of the element substrate;
a first resin portion that seals the acoustic wave device;
a second resin portion that is provided at least between the extended wiring line provided on the side surface and the first resin portion; and
a third resin portion; wherein
the second resin portion has a lower filler content than the first resin portion;

the element substrate includes a first corner portion that is a portion at which the second main surface adjoins the side surface;
the extended wiring line extends from the side surface to the first corner portion and the second main surface; and
the third resin portion is provided at least between the extended wiring line provided at the first corner portion and the first resin portion, and has a lower Young's modulus than the first resin portion.

12. The acoustic wave device according to claim 11, further comprising a cover layer, wherein
the functional electrode includes an IDT electrode;
the second resin portion is provided around the IDT electrode in a direction along the first main surface; and
the cover layer is provided on the second resin portion so as to cover the IDT electrode in a direction perpendicular or substantially perpendicular to the first main surface.

13. The acoustic wave device according to claim 11, further comprising an insulating layer, wherein
the element substrate includes at least a supporting substrate including a silicon material and a piezoelectric layer that is provided directly or indirectly on the supporting substrate; and
the insulating layer is provided between the extended wiring line and the supporting substrate.

14. The acoustic wave device according to claim 11, wherein
the element substrate includes at least a supporting substrate and a piezoelectric layer that is provided directly or indirectly on the supporting substrate;
when the element substrate is viewed in a cross section from a direction perpendicular to the first main surface, a side surface of the piezoelectric layer is located on an inner side of the side surface of the element substrate; and
the extended wiring line extends from the second main surface to the side surface of the piezoelectric layer and the side surface of the element substrate.

15. The acoustic wave device according to claim 11, wherein
the element substrate includes a supporting substrate and a piezoelectric layer that is provided directly on the supporting substrate;
the functional electrode is provided on the piezoelectric layer; and
an acoustic velocity of a bulk wave that propagates through the supporting substrate is higher than an acoustic velocity of an acoustic wave that propagates through the piezoelectric layer.

16. The acoustic wave device according to claim 11, wherein
the element substrate includes a supporting substrate, a piezoelectric layer that is provided indirectly on the supporting substrate, and an intermediate layer that is provided between the supporting substrate and the piezoelectric layer;
the functional electrode is provided on the piezoelectric layer;
an acoustic velocity of a bulk wave that propagates through the intermediate layer is lower than an acoustic velocity of an acoustic wave that propagates through the piezoelectric layer; and
an acoustic velocity of a bulk wave that propagates through the supporting substrate is higher than the acoustic velocity of the acoustic wave that propagates through the piezoelectric layer.

17. The acoustic wave device according to claim 11, wherein
the element substrate includes a supporting substrate, a piezoelectric layer that is provided indirectly on the supporting substrate, and an intermediate layer that is provided between the supporting substrate and the piezoelectric layer;
the functional electrode is provided on the piezoelectric layer;
the intermediate layer includes a low-acoustic-velocity film in which an acoustic velocity of a bulk wave that propagates therethrough is lower than an acoustic velocity of an acoustic wave that propagates through the piezoelectric layer, and a high-acoustic-velocity film in which an acoustic velocity of a bulk wave that propagates therethrough is higher than the acoustic velocity of the acoustic wave that propagates through the piezoelectric layer;
the low-acoustic-velocity film is provided between the piezoelectric layer and the supporting substrate; and
the high-acoustic-velocity film is provided between the low-acoustic-velocity film and the supporting substrate.

18. The acoustic wave device according to claim 11, wherein
the element substrate is bonded to one main surface of a mount substrate with the external terminal interposed therebetween; and
the first resin portion covers the one main surface of the mount substrate.

19. A front-end circuit comprising:
the acoustic wave device according to claim 11.

20. A communication apparatus comprising:
the front-end circuit according to claim 19; and
a signal processing circuit that processes a high-frequency signal.

* * * * *